US006954020B2

(12) United States Patent
Ma et al.

(10) Patent No.: US 6,954,020 B2
(45) Date of Patent: Oct. 11, 2005

(54) APPARATUS FOR ADJUSTING THE RESONANCE FREQUENCY OF A MICROELECTROMECHANICAL (MEMS) RESONATOR USING TENSILE/ COMPRESSIVE STRAIN AND APPLICATIONS THEREOF

(75) Inventors: Qing Ma, San Jose, CA (US); Andy Berlin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/376,880

(22) Filed: Feb. 27, 2003

(65) Prior Publication Data

US 2003/0160539 A1 Aug. 28, 2003

Related U.S. Application Data

(62) Division of application No. 09/883,036, filed on Jun. 11, 2001, now Pat. No. 6,747,389.

(51) Int. Cl.[7] .............................................. H03H 9/125
(52) U.S. Cl. ...................................................... 310/309
(58) Field of Search ................................ 310/309, 307, 310/306; 60/527; 257/415, 467; 374/187

(56) References Cited

U.S. PATENT DOCUMENTS

| | | | | | |
|---|---|---|---|---|---|
| 5,025,346 | A | * | 6/1991 | Tang et al. | ............... 361/283.1 |
| 5,455,547 | A | * | 10/1995 | Lin et al. | ..................... 333/186 |
| 5,491,604 | A | * | 2/1996 | Nguyen et al. | ............. 333/197 |
| 5,537,083 | A | * | 7/1996 | Lin et al. | ..................... 333/186 |
| 6,236,281 | B1 | * | 5/2001 | Nguyen et al. | ............. 333/186 |
| 6,313,562 | B1 | * | 11/2001 | Barnes et al. | ............... 310/306 |

OTHER PUBLICATIONS

Hsu "Mechanically Temperature–compensated Flexural–Mode Micro– mechanical Resonator" IEEE (Dec. 12, 2000) pp. ☐☐(399–402).*

PCT International Search Report for PCT/US02/16468, Oct. 11, 2002.

Hsu, Wan–Thai et al., "Mechanically Temperature–Compensated Flexural–Mode Micromechanical Resonators", *International Electron Devices Meeting 2000. IEDM. Technical Digest.* San Francisco, CA, (Dec. 10–13, 2000), New York: *IEEE, US* (Dec. 10, 2000) pp. 399–402.

Adams, Scott G. et al., "Independent Tuning Of Linear And Nonlinear Stiffness Coefficients", Journal of Microelectromechanical Systems, vol. 7, No. 2, (Jun. 1998), pp. 172–180.

Nguyen, Clark T.–C, "Micromachining Technologies For Miniaturized Communication Devices", *SPIE Conference on Micromaching and Microfabrication Process Technology IV,* Santa Clara, California (Sep. 1998) vol. 3511, pp. 24–38.

* cited by examiner

*Primary Examiner*—Tom Dougherty
*Assistant Examiner*—Karen Beth Addison
(74) *Attorney, Agent, or Firm*—Blakely, Sokoloff, Taylor & Zafman LLP

(57) ABSTRACT

A method for varying the resonance frequency of a resonator beam is disclosed. The method comprises first manufacturing a resonator beam having a first end and a second end. The resonator beam is suspended above a substrate by the first end and the second end. At least one end of the resonator beam is connected to an actuator that applies an actuation force to the resonator beam to apply tensile strain or compressive strain onto said resonator beam. By varying the amount of actuation force, the resonance frequency of the resonator beam may be tuned. Additionally, by varying the magnitude and direction of the actuation force, the resonator beam may be used as a temperature sensor or a temperature compensated resonator.

38 Claims, 22 Drawing Sheets

APPARATUS FOR ADJUSTING THE RESONANCE FREQUENCY OF A MICROELECTROMECHANICAL (MEMS) RESONATOR USING TENSILE/ COMPRESSIVE STRAIN AND APPLICATIONS THEREOF

CROSS-REFERENCE TO RELATED APPLICATIONS

This application is a divisional of, and claims priority under 35 U.S.C. § 120 from, U.S. patent application Ser. No. 09/883,036, filed Jun. 11, 2001, now issued as U.S. Pat. No. 6,747,389.

TECHNICAL FIELD OF THE INVENTION

This invention relates to microelectromechanical system (MEMS) resonators, and more particularly, to a device for adjusting the resonance frequency of a MEMS resonator using tensile/compressive strain.

BACKGROUND OF THE INVENTION

The advantages of using single crystal semiconductors such as silicon as a mechanical material have long been recognized. For example, it's strength and high intrinsic quality factor make it attractive for MEMS resonant devices. It is regularly available as an integrated circuit substrate and can be processed using methods developed by the IC industry. Recently, the preferred material for forming MEMS resonators is polycrystalline silicon, or simply, polysilicon. This material is advantageous because it is readily used in integrated circuits (often used as transistor gates), provides flexibility in geometry, and ease of use.

MEMS resonators are now being developed for signal filtering and for use as clocks in oscillators. However, for a MEMS resonator, the resonance frequency of the resonator after the manufacturing process is usually different from the desired value due to processing variations. Thus, although one may desire to have a MEMS resonator have a resonance frequency of 1 GHz, during the actual manufacturing process, it is difficult to manufacture a MEMS resonator with exactly a resonance frequency of 1 GHz.

One of the primary parameters that affect the resonance frequency is the dimension of the resonator. While there are post-manufacturing techniques, such as laser trimming, that may be used to adjust the dimensions, and thus the resonance frequency, of the MEMS resonator, this laser trimming is also difficult to accurately control. Therefore, it is costly and/or difficult to precisely manufacture a MEMS resonator having the desired resonance frequency. Another method of adjusting the dimension of a resonator is to use local heating, which will cause expansion of resonator. However, this technique requires a dedicated circuit on the IC to effectuate the local heating.

It has been found that the resonance frequency of a MEMS resonator may be adjusted by applying tensile strain or compressive strain to the resonator. Specifically, the resonance frequency of a resonator will increase when subjected to tensile strain and will decrease when under compressive strain.

BRIEF DESCRIPTION OF THE FIGURES

The invention is best understood by reference to the figures wherein references with like reference numbers generally indicate identical, functionally similar, and/or structurally similar elements. The drawing in which an element first appears is indicated by the leftmost digit(s) in the reference number in which.

DETAILED DESCRIPTION OF THE PREFERRED EMBODIMENTS

Embodiments of a means for applying tensile or compressive strain to a resonator is described in detail herein.

Further these structures are applied in the context of temperature compensated resonators and temperature sensors. In the following description, numerous specific details are provided in order to provide a thorough understanding of embodiments of the invention. One skilled in the relevant art will recognize, however, that the invention can be practiced without one or more of the specific details, or with other methods, materials, components, etc. In other instances, well known structures, materials, or operations are not shown or described in detail to avoid obscuring aspects of various embodiments of the invention. Furthermore, it is understood that the various embodiments shown in the Figures are illustrative representations, and are not necessarily drawn to scale.

Reference throughout the specification to "one embodiment" or "an embodiment" means that a particular feature, structure, material, or characteristic described in connection with the embodiment is included in at least one embodiment of the present invention. Thus, the appearances of the phrase "in one embodiment" or "in an embodiment" in various places throughout the specification are not necessarily all referring to the same embodiment. Furthermore, the particular features, structures, materials, or characteristics may be combined in any suitable manner in one or more embodiments.

The manufacture and use of MEMS resonators for filtering or oscillator applications is now being developed, with commercial adoption envisioned shortly. Typically, polysilicon is used as the resonator material. One common type of MEMS resonator is the "bending beam" structure (also referred to herein as a "resonator beam"). In a bending beam structure, a beam of polysilicon material is suspended above a semiconductor substrate by anchors at both ends of the beam. The beam is excited by an electrical input that can induce mechanical vibration in the beam. Typically, the electrical input is provided from below the beam.

Figure 1:
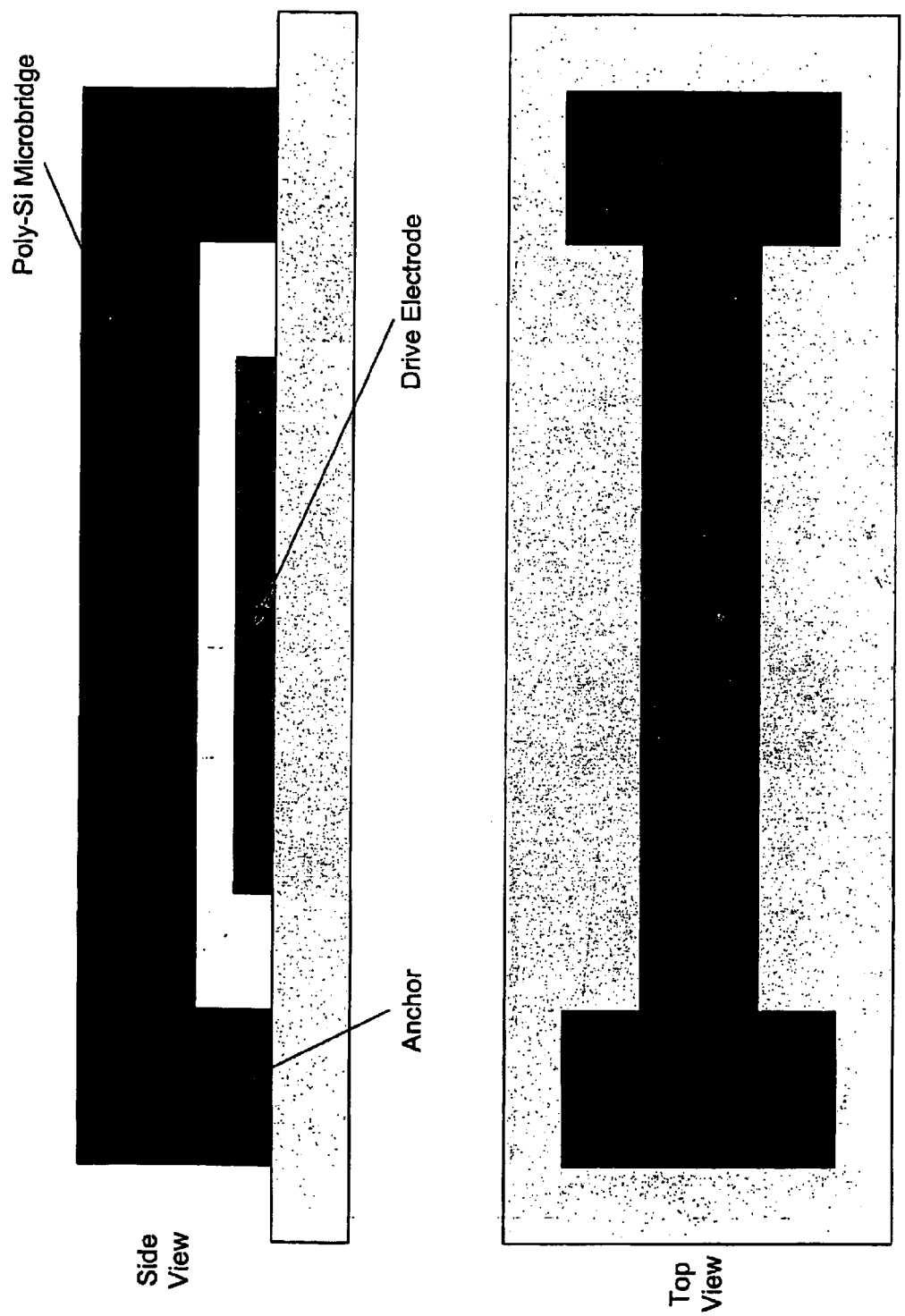
FIG. 1 illustrates a prior art bending beam MEMS resonator.

FIG. 1 shows an exemplary prior art bending beam structure. As seen in FIG. 1, a bending beam 101 is suspended at its ends above a semiconductor substrate 107 by anchors 103 and 105. The anchors 103 and 105 are secured to the substrate 107. A drive electrode 109 is placed underneath the bending beam 101. The drive electrode 109 is used to excite the bending beam 101 into vibrating. As is known in the art, the resonance frequency of the bending beam 101 is based upon several parameters, including the thickness of the beam, the density of the material forming the beam, the Young's modulus of the beam, and the length of the beam.

Specifically, $$\omega \propto \frac{t}{L^2} \sqrt{\frac{E}{\rho}} \left(1 + \frac{L^2}{7t^2} S\right)$$

where t is the beam thickness, L is the beam length (the length L is measured between the anchors 103 and 105 of FIG. 1), E and ρ are the Young's modulus and the density of the material of the beam, and S is the elastic strain applied on the beam. When the temperature rises, L and t increase, but the effect of L dominates. Therefore, frequency tends to decrease.

If a compressive strain is applied with increasing temperature, then the frequency sensitivity to temperature is enhanced. Conversely, if a temperature dependent tensile strain is applied, this may be used to compensate for the beam expansion effect. Such a condition is governed by $$\frac{d\omega}{dT} = 0$$

or $$\alpha_b \left(1 + \frac{L^2}{7t^2} S\right) = \frac{L^2}{7t^2} \frac{dS}{dT}$$

where $\alpha_b$ is the coefficient of thermal expansion of the beam. For practical situations S<<1, therefore, the applied strain must satisfy $$\frac{dS}{dT} = \frac{7t^2}{L^2} \alpha_b$$

While it is preferred that the resonance frequency of a MEMS resonator be precisely controlled by varying the size and characteristics of the breathing bar or bending beam structure, in practical manufacturing processes, it is not always possible to precisely control these parameters. Therefore, post-manufacturing processing, such as laser trimming is necessary to correct the actual manufactured resonance frequency to the desired resonance frequency. Specific details for the manufacturing and operation of a MEMS resonator can be found in "Micromachining Technologies for Miniaturized communication devices," by C. T. C. Nguyen, *Proceedings of SPIE*: Micromachining and Microfabrication, Santa Clara, Calif., Sep. 20–22, 1998, pages 24–38.

Figure 2:
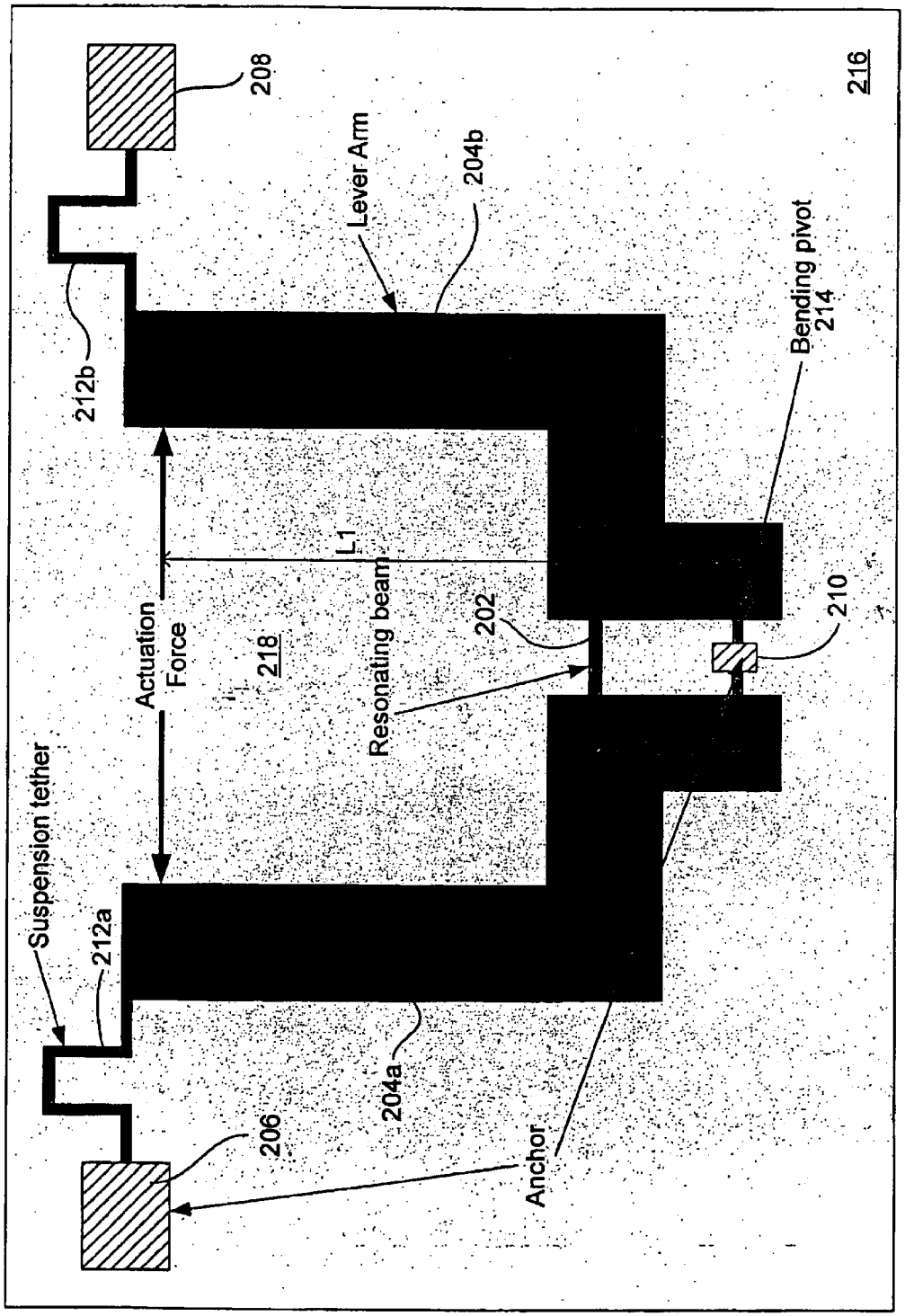
FIG. 2 is a top view of a lever arm structure for providing tensile strain on a resonator according to the present invention.

FIG. 2 illustrates a resonator beam 202 that is held on either side by lever arms 204a and 204b. Both the lever arm 204a and the lever arm 204b are suspended on anchors 206, 208, and 210. The upper portion of lever arm 204a is connected to anchor 206 by means of the flexible suspension tether 212a. Similarly, the upper portion of lever arm 204b is connected to anchor 208 through flexible suspension tether 212b. The lower portions of the lever arm 204a and 204b are connected to the anchor 210 by means of a bending pivot 214.

As seen in FIG. 2, the lever arms 204a and 204b are symmetric on either side of the resonator beam 212. Because of the bending pivots 214 and the suspension tethers 212a and 212b, thermal expansion of the substrate 216 upon which these elements are formed is decoupled from the suspended structures. An open area 218 between the lever arms 204a and 204b is provided to accommodate various possible mechanisms (described further below) to provide an actuation force that moves the upper portion of lever arm 204a towards anchor 206 and the upper portion of lever arm 204b towards anchor 208. The lever arms 204a and 204b are sufficiently stiff so that its bending is negligible.

When an actuation force is provided to the lever arms 204a and 204b, this causes the lever arms to pivot about anchor 210 by means of bending pivot 214. $L_1$ is the distance between the point of pressure by the actuation force and the bending pivot 214. $L_2$ is the distance between the resonator beam 202 and the bending pivot 214. The ratio $L_1$ to $L_2$ governs the amount of strain that is imparted onto resonator beam 202 for a given actuation force. The material of the resonator beam 202 is selected to preferably have a high tensile yield stress.

Figure 3:
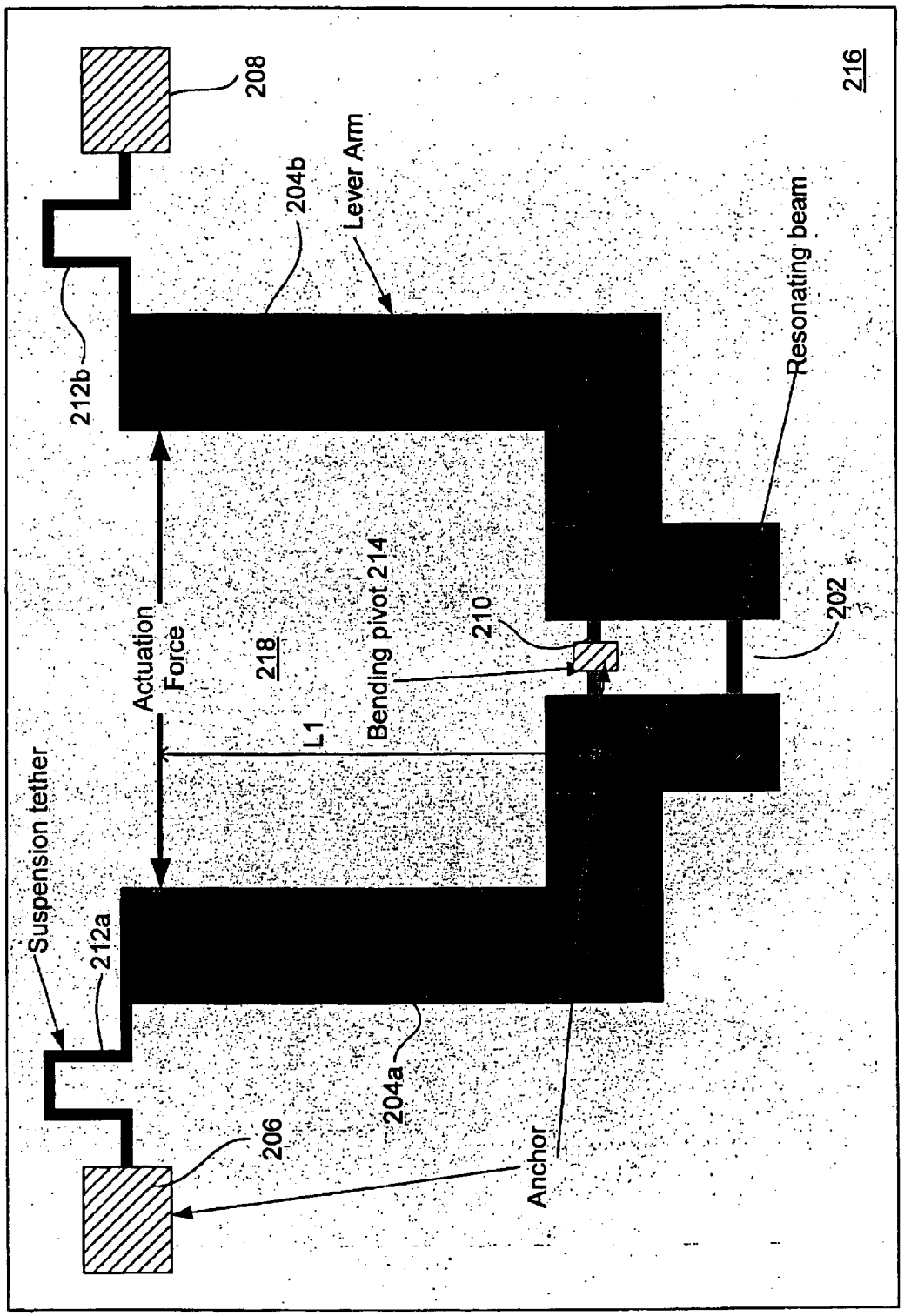
FIG. 3 is a lever arm structure for providing compressive strain on a resonator according to the present invention.

Turning to FIG. 3, the position of the anchor 210 and bending pivot 214 is switched with the position of the resonator beam 202. An actuation force applied to the lever arms 204 and 204b will cause the lever arms to pivot about anchor point 210 and result in a compressive strain to be placed onto the resonator beam 202. Thus, whereas the structure shown in FIG. 2 causes tensile strain to be placed on to the resonator beam 202, the apparatus of FIG. 3 causes compressive strain to be placed on to the resonator beam 202. Compressive strain tends to decrease the resonant frequency of the resonator beam 202. Tensile strain will tend to increase the resonance frequency of the resonator beam 202.

Figure 4:
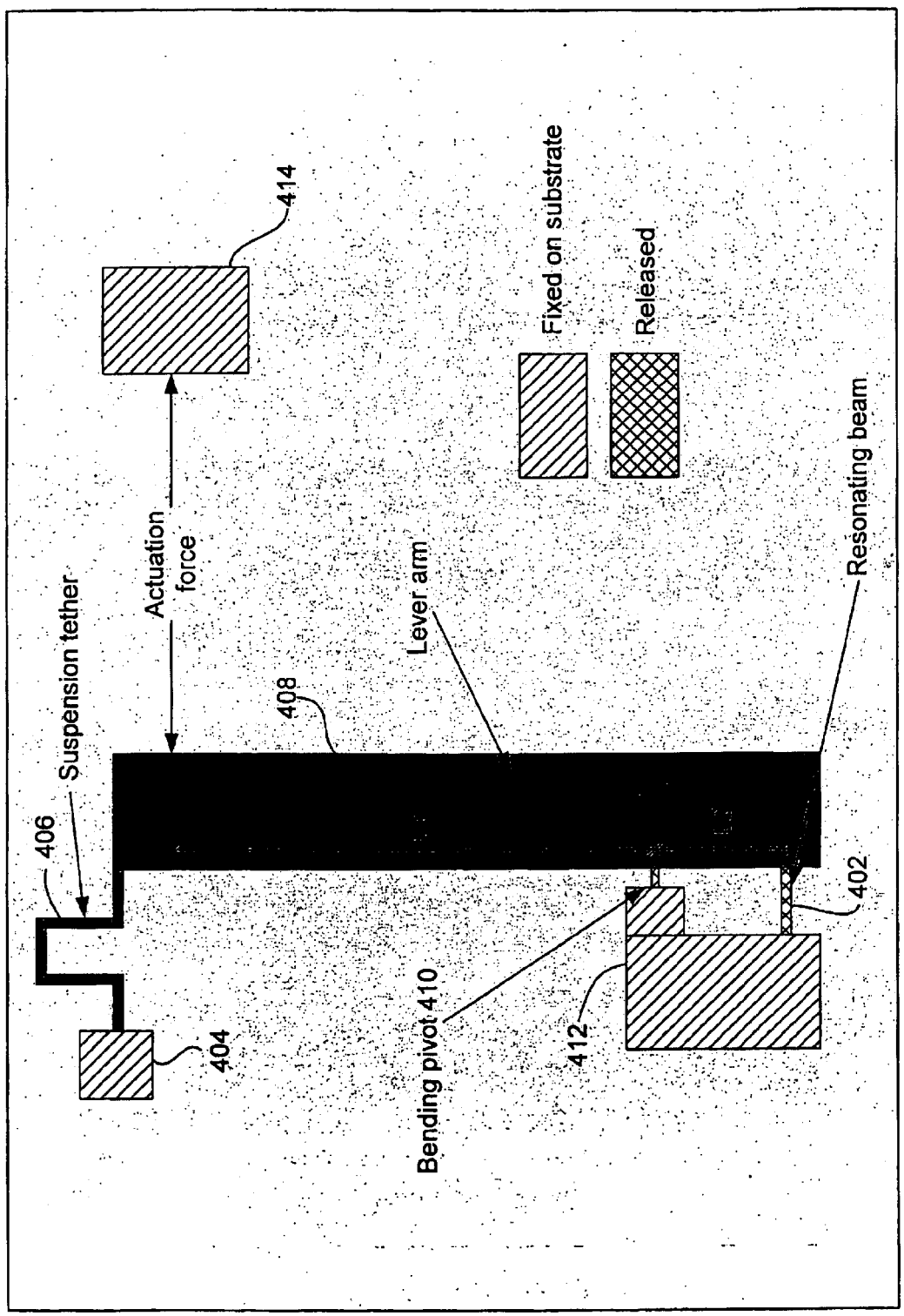
FIG. 4 is a single arm lever structure adapted for placing tensile strain on a resonator according to the present invention.

Turning to FIG. 4, a single lever structure is shown. In this structure, a lever arm 408 is connected at anchor 404 and 412. The upper portion of the lever arm 408 is connected to anchor 404 by means of a suspension tether 406. A lower portion of the lever arm 408 is connected to the anchor 412 through bending pivot 410. The resonator beam 402 has one end connected to the lower portion of the lever arm 408 and another end connected to the anchor 412. An actuation force applied to the upper portion of the lever arm 408, bracing against anchor 414 as a fixed support, causes the lever arm 408 to pivot about the bending pivot 410. This causes tensile strain to be applied to resonator beam 402.

The single lever structure of FIG. 4 is employed advantageously for use with certain types of actuation mechanisms. Further, lever arm 408 is sufficiently stiff so it's bending is negligible under actuation forces. Like above, the ratio of $L_1$ divided by $L_2$ governs the amount of strain imparted to the resonator beam 402. A large enough ratio ensures a sufficiently fine strain adjustment on the resonator beam 402.

Figure 5:
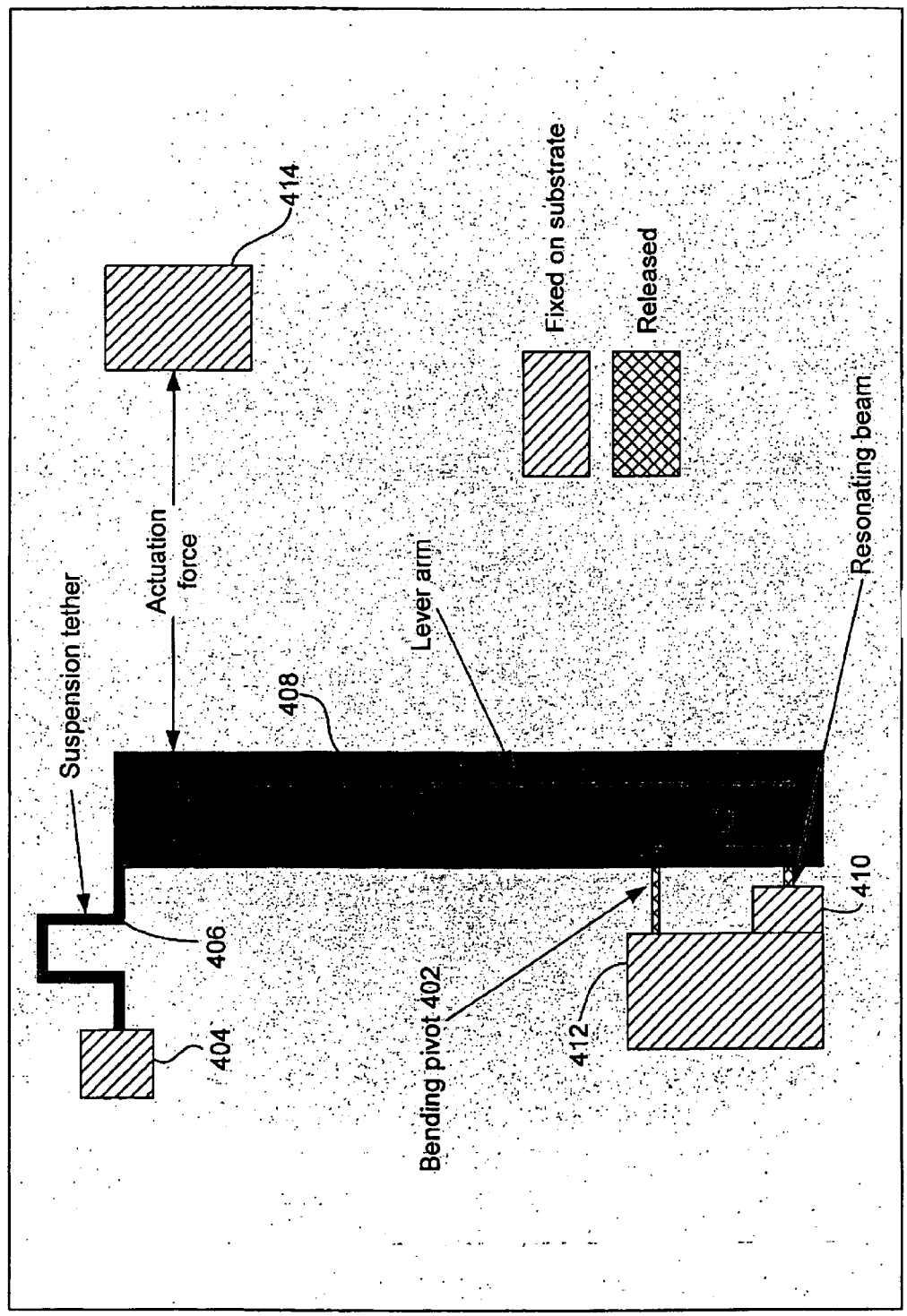
FIG. 5 is a single arm lever structure adapted for placing compressive strain on a resonator according to the present invention.

Turning to FIG. 5, the single lever structure of FIG. 4 is shown, except that the positions of the resonator beam 402 and the bending pivot 410 are switched. By switching these positions, an actuation force provided on to the upper portion of the lever arm 408 will cause compressive strain to be placed on the resonator beam 402.

It should be appreciated that the lever structures shown in FIGS. 2–5 are exemplary only and that many variations in their configuration are possible. As noted above, the lever structures shown in FIGS. 2–5 require an actuator to provide an actuation force on to the lever arms. As further detailed below, several different types of actuators are contemplated in the present invention.

Figure 6:
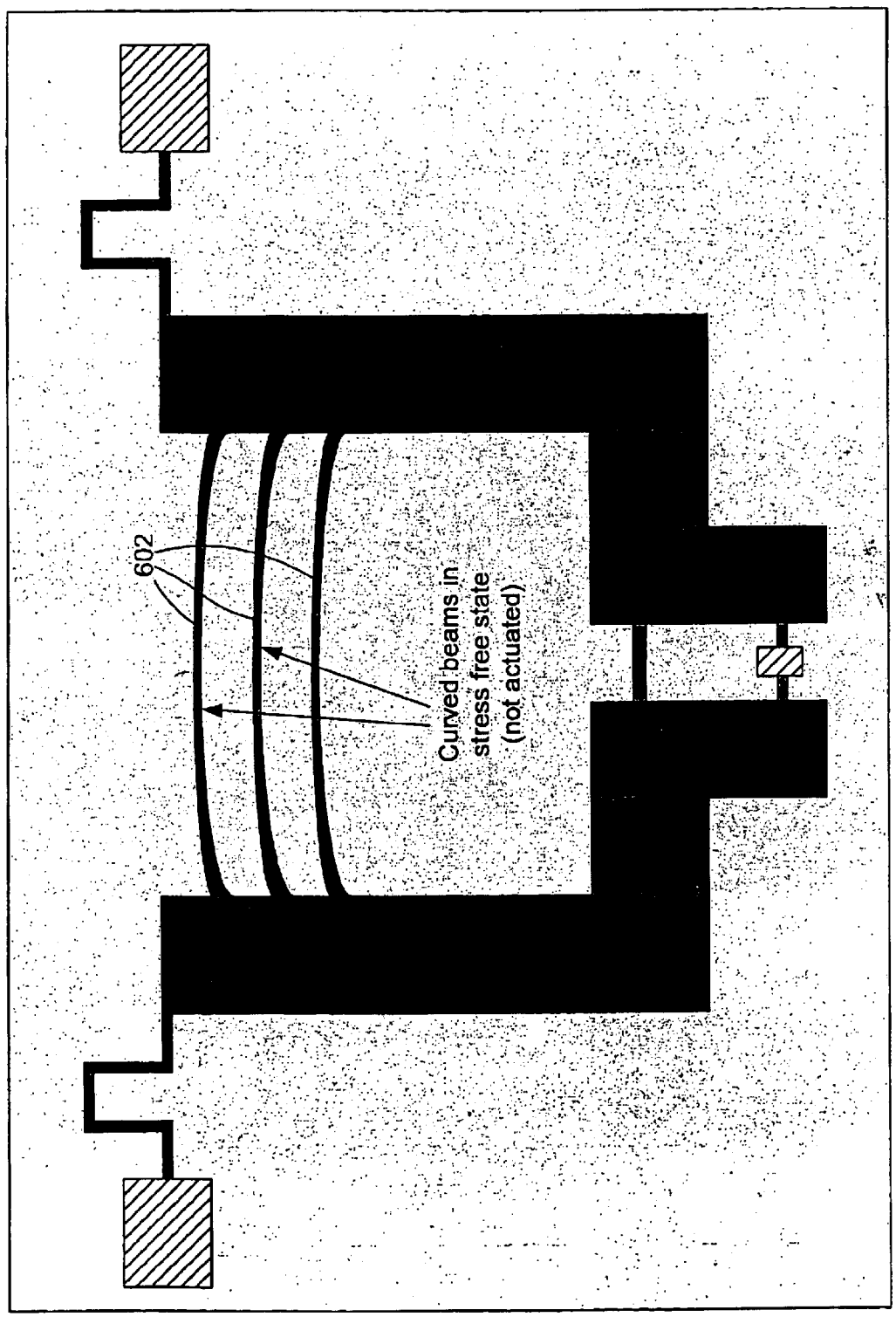
FIG. 6 illustrates a dual lever arm with curved beams adapted to place tensile strain on a resonator according to the present invention.
Figure 7:
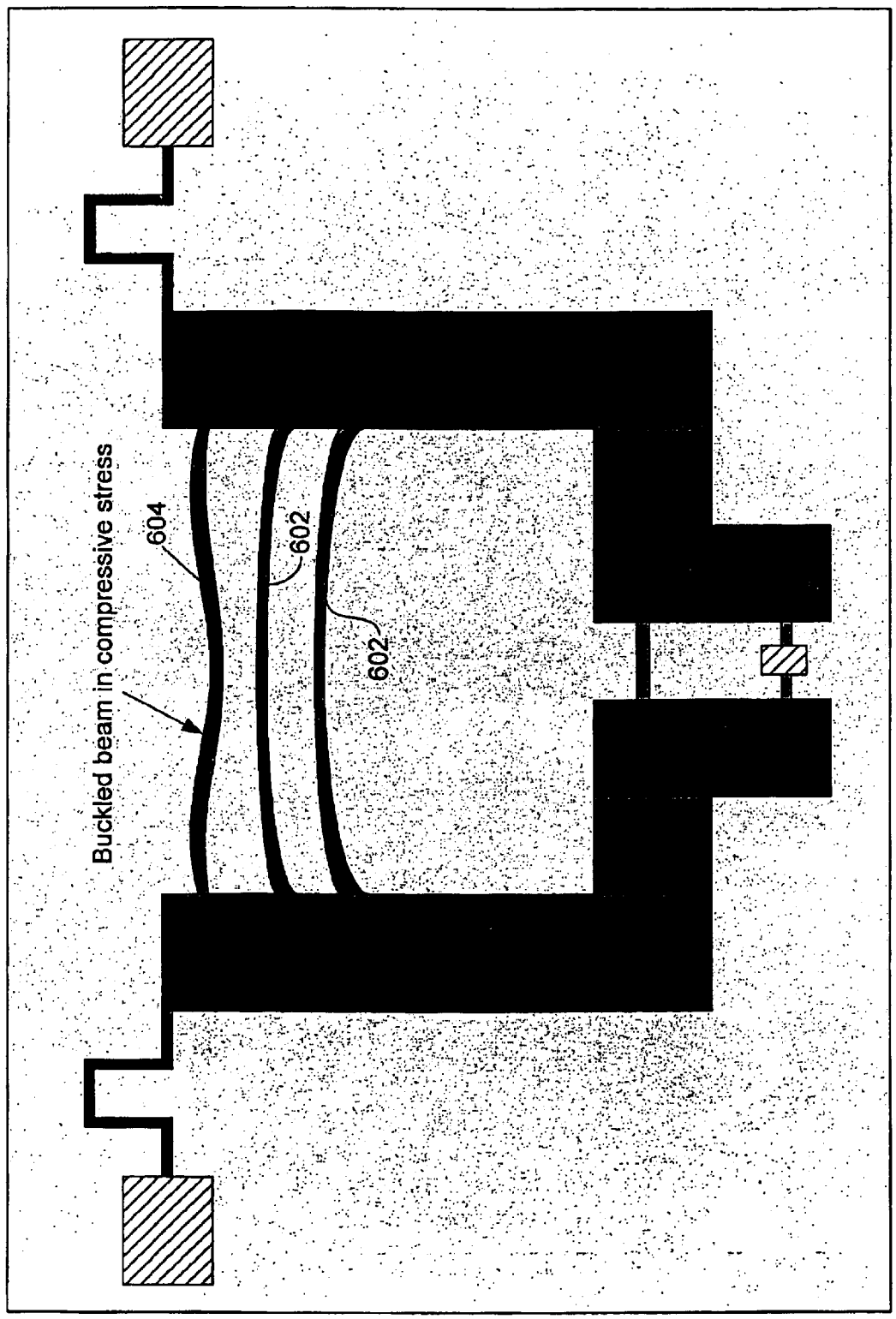
FIG. 7 shows the apparatus of FIG. 6 during placement of tensile strain on the resonator.

Specifically, turning to FIG. 6, multiple curved beams 602 may be placed between the upper portion of the lever arms of the structure of FIGS. 2 and 3. The beams 602 are defined in the photolithography and etching step to be curved in the stress free state and may be formed from polysilicon or like materials. In order to effectuate actuation forces on the lever arms, the beams (one or more) 602 are buckled into a compressive state, as shown in FIG. 7. The buckled beam 604 exerts a lateral stress pushing apart the lever arms.

Depending upon how much strain is needed on the resonator beam, a curved beam at a particular location or several beams at various locations can be selected to be deformed into the buckled state. A beam in a buckled state 604 applies strain to the resonator beam. Theoretical or empirical models may be used to select the appropriate beams for buckling deformation.

Figure 8:
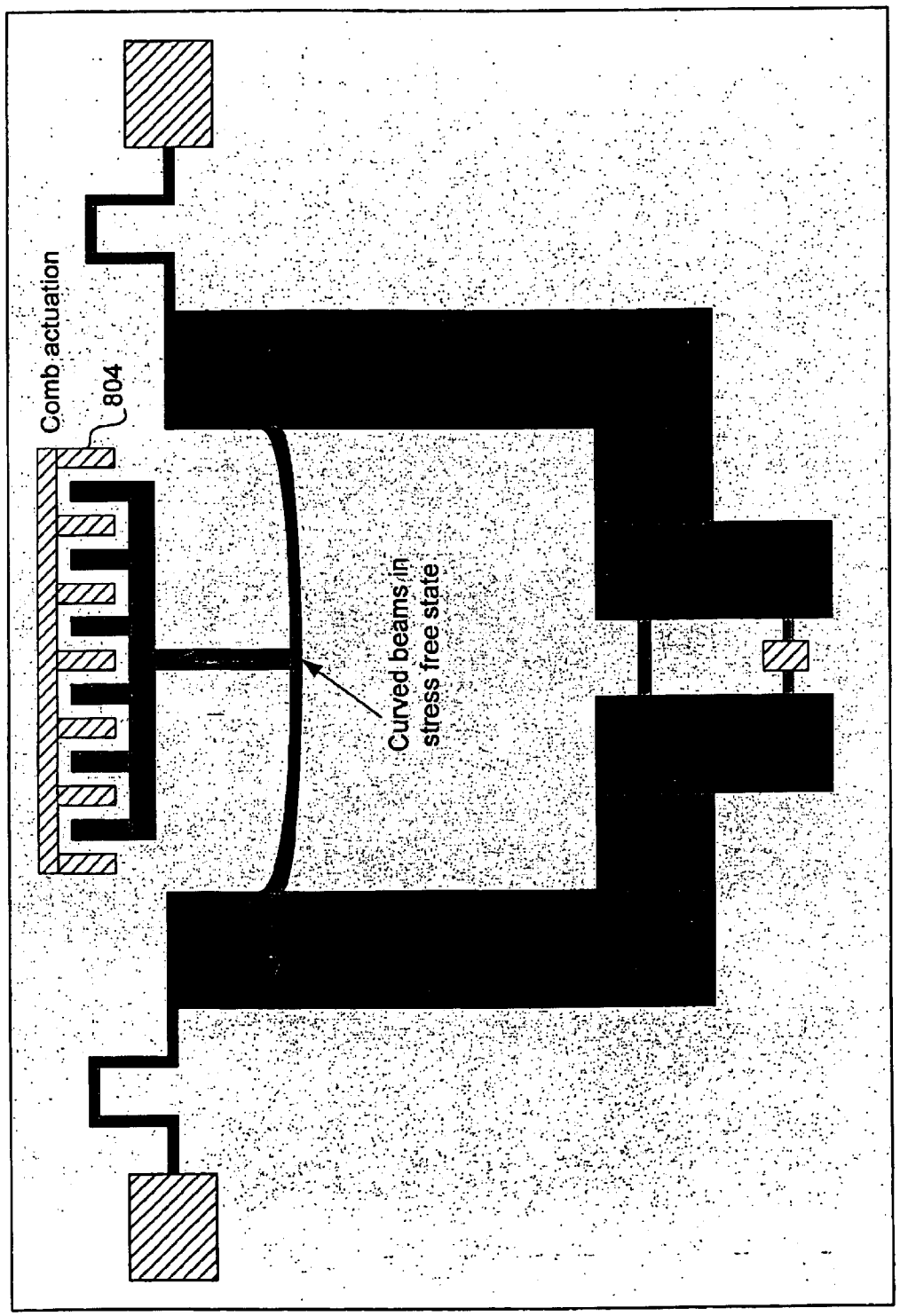
FIG. 8 illustrates a curved beam dual lever arm structure using a comb actuation means to induce tensile strain on a resonator according to the present invention.

Turning to FIG. 8, a comb structure for causing the buckling of the curved beam 802 may be employed, the comb structure 804 when activated will pull on the beam 802.

Preferably, the beam 802 is curved in a direction opposite to the direction upon which the comb structure 804 pulls. When the comb structure 804 is pulling, the beam 802 reduces its curvature and therefore undergoes compression, transmitting force to the lever arms. This configuration is capable of much larger forces exerting on the lever arms compared to direct pulling on the lever arms using comb structures.

Figure 9:
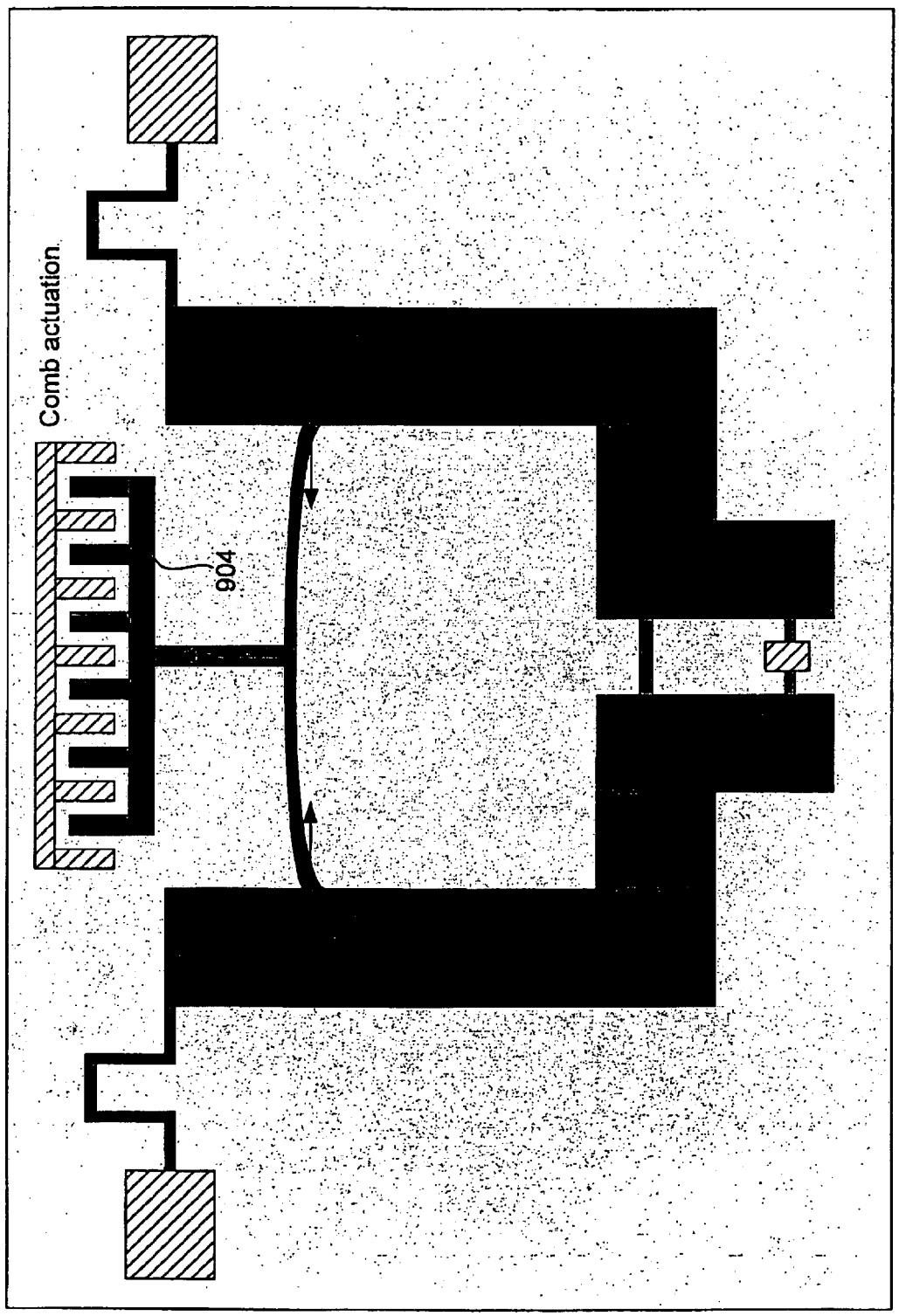
FIG. 9 illustrates a curved beam dual lever arm structure using a comb actuation means for placing compressive strain on a resonator according to the present invention.

FIG. 9 shows a similar mechanism where a comb structure 904 is pulling on a curved beam 902. In this embodiment, the curved beam 902 in its stress free state is curved towards the comb structure 904. When the comb structure 904 is pulling, the curved beam 902 increases its curvature and therefore undergoes a tensile stress that exerts a pulling force in the lever arms. This configuration is capable of much larger forces exerted on the lever arms compared to direct pulling on the arms using comb structures.

Figure 10:
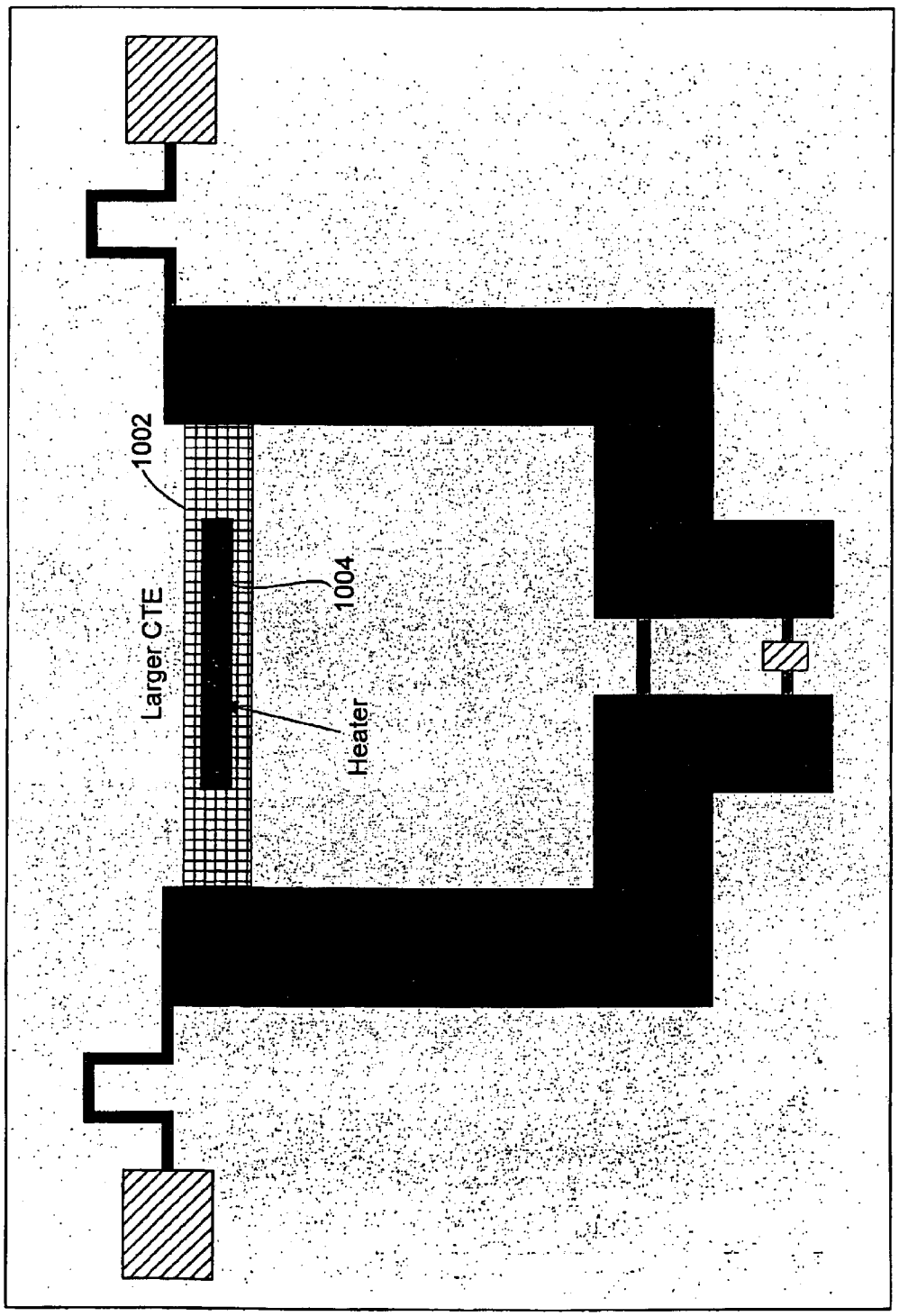
FIG. 10 illustrates a heater beam for actuating a dual lever arm structure for inducing strain on a resonator according to the present invention.

FIG. 10 illustrates another type of actuation mechanism that can exert actuation forces on to the lever arms. In particular, FIG. 10 shows a large coefficient of thermal expansion (CTE) beam 1002 that is placed between the lever arms. The CTE beam 1002 includes a heater 1004 integrated herein. The heater 1004 may be, for example, a resistive heater. By controlling the temperature of the CTE beam 1002, varying amounts of strain can be applied to the resonator beam. In one embodiment, the CTE beam 1002 may consist of a single material that could be used for linear expansion. Alternatively, the CTE beam 1002 may be a bimorph composite that bends when undergoing a temperature change. Different material combinations can produce effective expansion or contraction when heated by the heater 1004.

Figure 11:
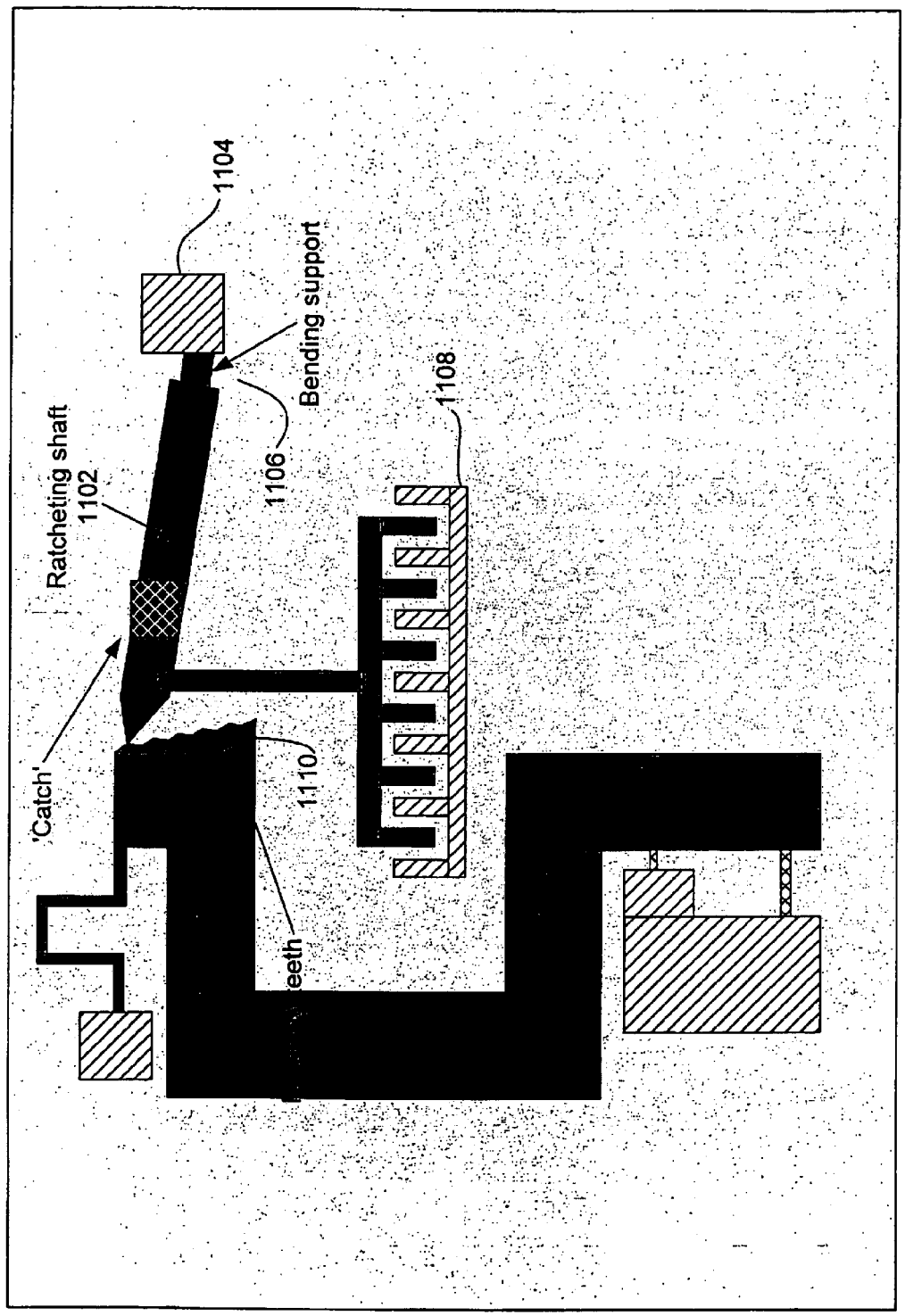
FIG. 11 illustrates a ratcheting shaft actuation mechanism for actuating a single lever arm structure according to the present invention.

FIG. 11 illustrates yet another actuation mechanism referred to as a ratcheting shaft. As seen in FIG. 11, a ratcheting shaft 1102 is connected to an anchor 1104 through a bending support 1106. The ratcheting shaft 1102 is moved to pivot about bending support 1106 by a comb structure 1108. By activating the comb structure 1108, the ratcheting shaft will engage various positions of ratcheting teeth 1110. The ratcheting shaft 1102 when engaged with ratcheting teeth 1110 cause actuation forces to push on the lever arm. Thus, by pushing/pulling on the ratcheting shaft 1102 so that its tip is locked at various positions on the ratcheting teeth 1110, various amounts of strain can be achieved on the resonator beam.

Figure 12:
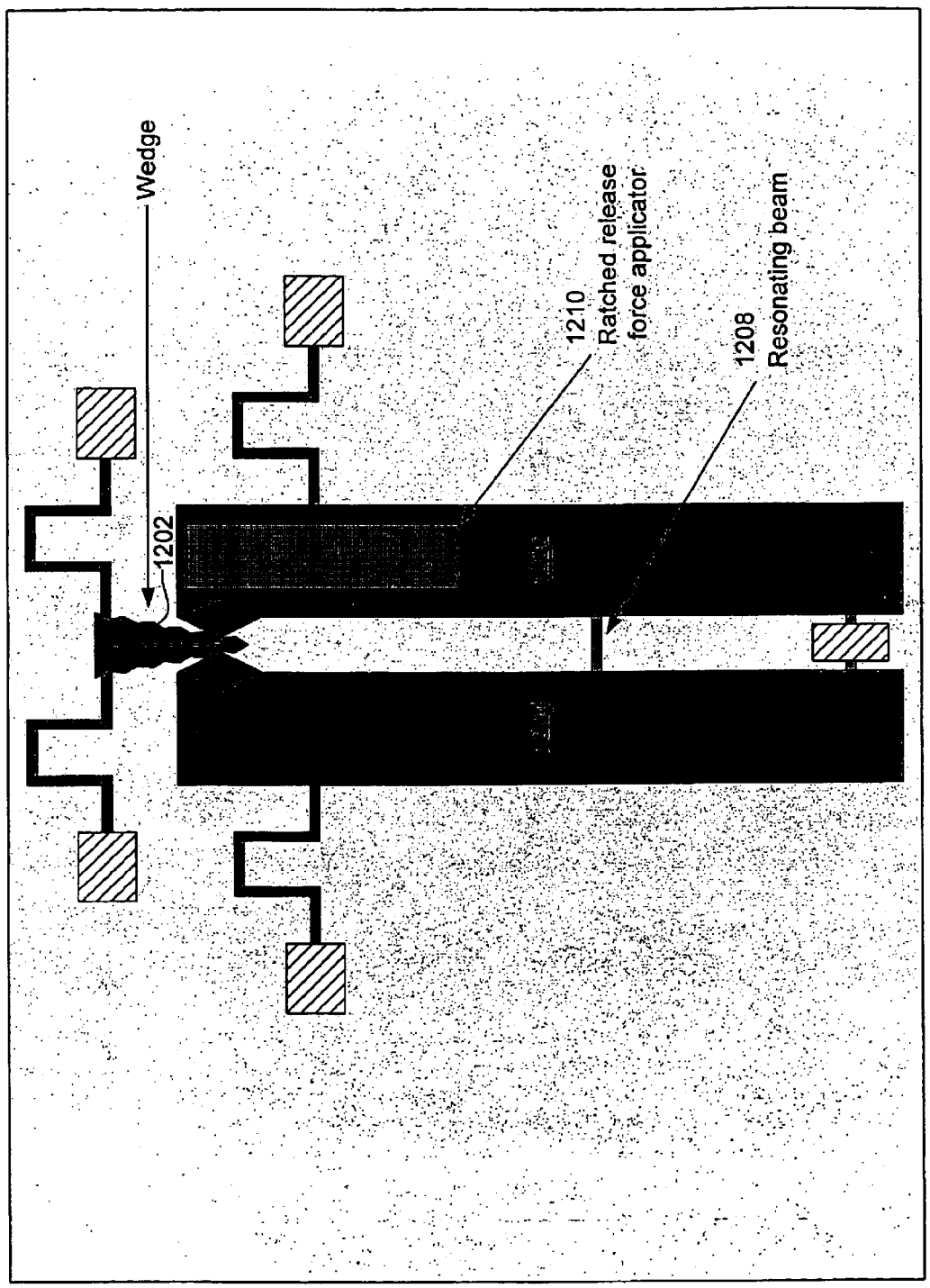
FIG. 12 illustrates a ratcheting wedge for actuating a dual lever arm structure according to the present invention.

FIG. 12 shows another type of ratcheting mechanism referred to as a ratcheting wedge. As seen in FIG. 12, a wedge 1202 is placed between lever arms 1204 and 1206. The wedge has teeth that engage with protrusions on the lever arm 1204 and 1206. By placing the wedge so that it is locked at various positions, various amounts of strain can be achieved on the resonator 1208.

Optionally, the wedge 1202 may be constructed out of a magnetic material that will exert force to drive the wedge into position in response to the application of a magnetic field. By engaging the ratchets, the force on the resonating number 1208 is maintained even after the magnetic field is removed.

Alternatively, a method for releasing the ratchet to permit retuning of the device may also be incorporated. This may take the form of a release catch 1210 or hook suitable for external manipulation with a microprobe. Alternatively, the release catch may take the form of a magnetic alloy that responds to application of a magnetic field. In the event that both magnetic actuation of the wedge 1202 and a release mechanism is employed, it is advantageous for the orientation of the magnetic field that drives the wedge actuation to be substantially perpendicular to the orientation of the magnetic field used to drive the ratchet release mechanism.

Figure 13:
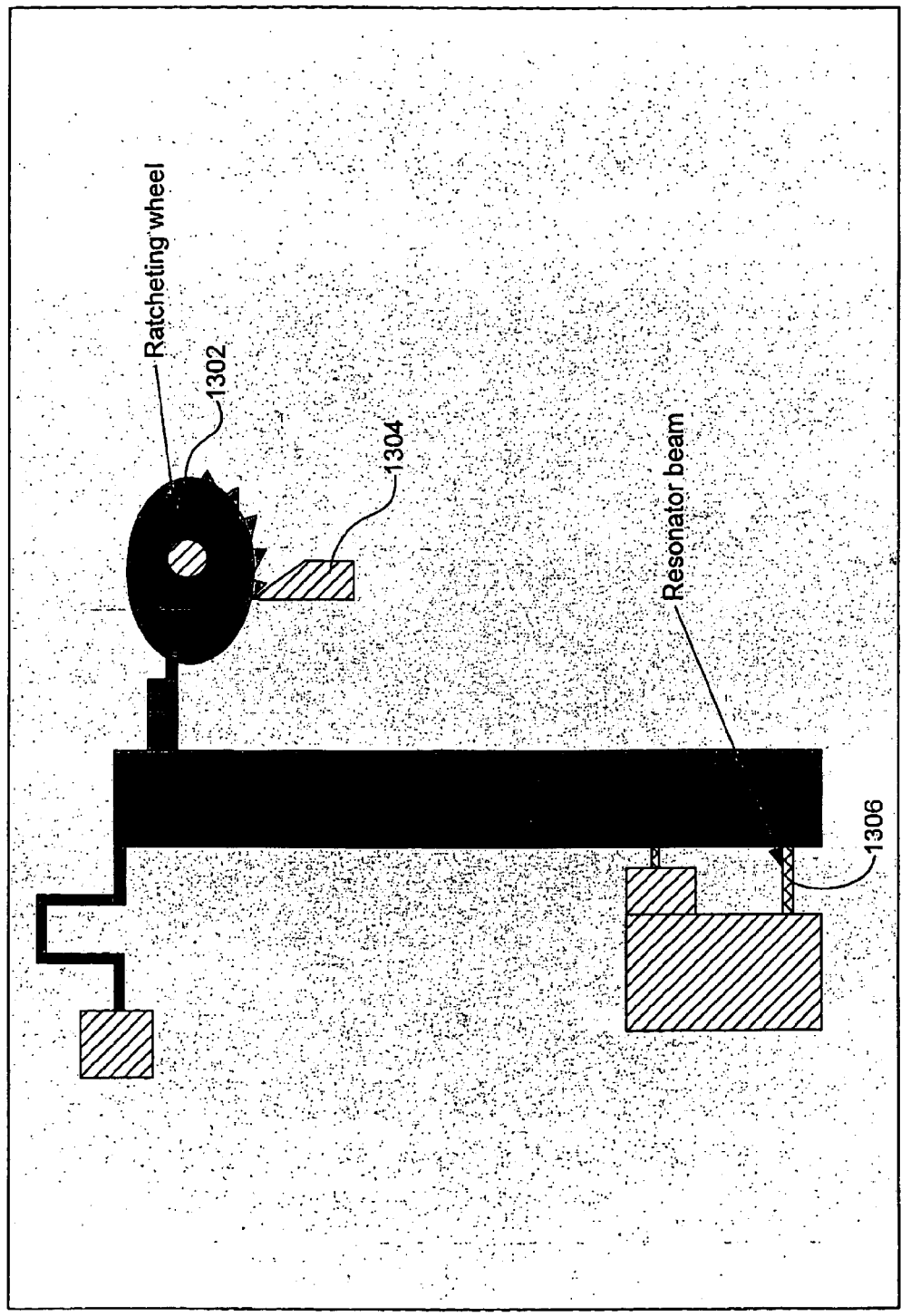
FIG. 13 illustrates a ratcheting wheel actuation mechanism for actuating a resonator according to the present invention.

Turning to FIG. 13, a ratcheting wheel actuation mechanism is shown. In this embodiment, a ratcheting wheel 1302 with ratcheting teeth can be used to set strain. In particular, the ratcheting wheel 1302 engages an anchor 1304 with the ratcheting teeth. The amount of strain on the resonator beam 1306 depends upon the rotation of the ratcheting wheel 1302. The ratcheting wheel 1302 can be actuated by electrostatic force, a comb drive, or externally.

With the description of lever arm structures and associated actuations structures for providing tensile strain or compressive strain on to a resonator beam described above, an application of such technology is now described. In particular, it has been found that the resonance frequency of a microbridge beam is related to its dimension and other physical perimeters. As previously noted, as the temperature rises, both the length of the microbridge beam and the thickness of the beam increases. However, the effect of the change in length dominates, so that frequency tends to decrease as temperature increases.

If a compressive strain is applied which is monotonically increasing with temperature, then the frequency sensitivity to temperature is exacerbated. Conversely, if a temperature dependent tensile strain is applied, this may be used to compensate for the beam expansion affect. Thus, the application of a tensile strain can be used to compensate for temperature variation, and therefore, a resonator may be made to be relatively temperature stable. In a different application, by having a compressive strain be applied to the resonator beam increasing with temperature, then the frequency sensitivity of the resonator beam to temperature can be enhanced. In such a situation, the resonator beam can be used as a temperature sensor.

Figure 14:
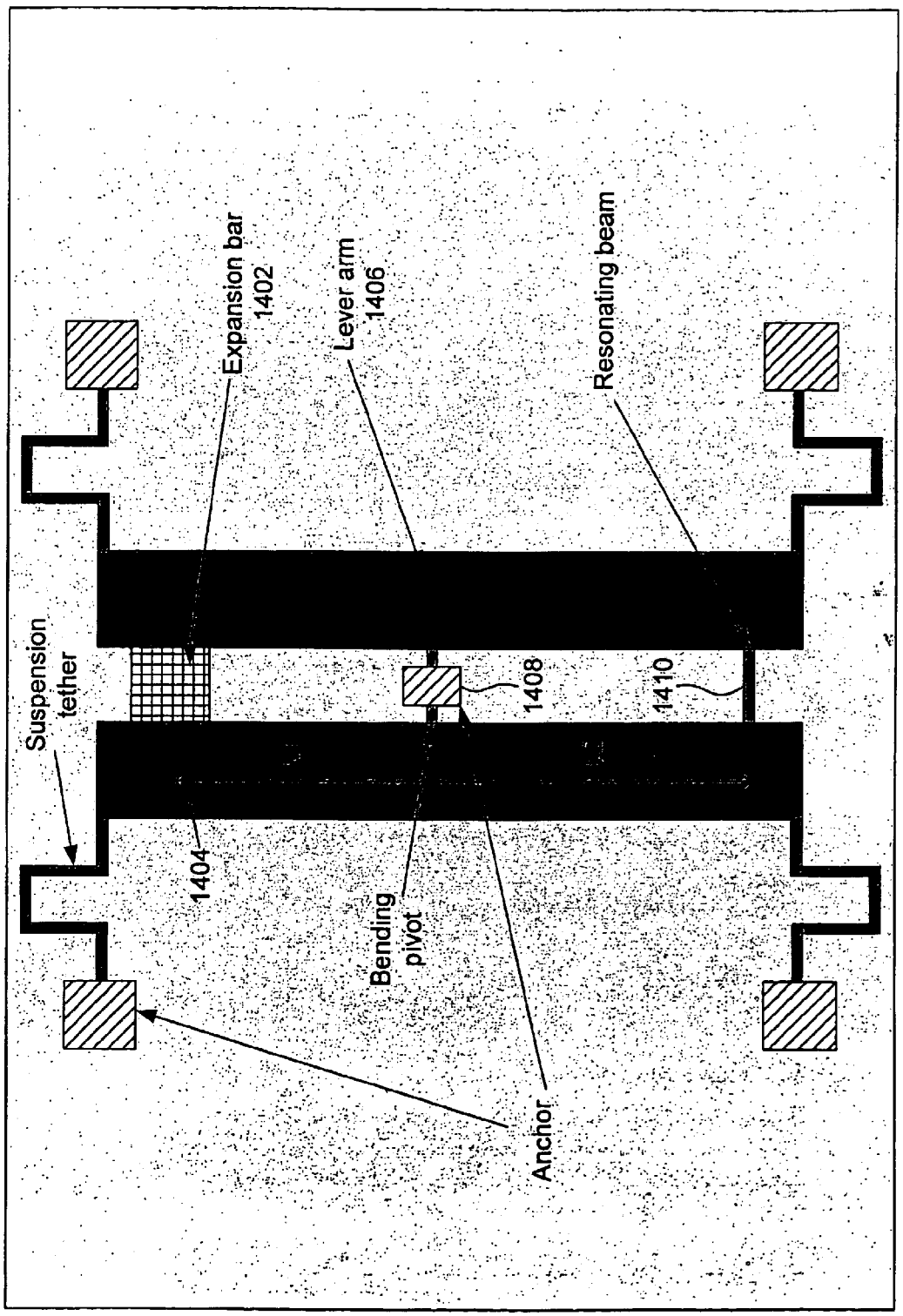
FIG. 14 illustrates a temperature sensor formed according to the present invention.

Specifically, as seen in FIG. 14, an expansion bar 1402 made of a material with a relatively large thermal expansion coefficient ($\alpha_e$) is placed between two lever arms 1404 and 1406. As the temperature increases, the expansion bar 1402 expands disproportionally and applies an actuation force onto the lever arms 1404 and 1406. Because of the positioning of the bending pivot 1408 and the resonator beam 1410, this in turn causes a compressive strain to be placed onto the resonator beam 1410. This will reduce the resonance frequency of the resonator bar 1410. The compressive strain applied on the resonator beam 1410 is approximately governed by:

$$S=(\alpha_e-\alpha_b)\Delta TL_2/L_1$$

where $\alpha_b$ is the coefficient of thermal expansion for the resonator beam 1410.

Thus, the arrangement set forth in FIG. 14 tends to enhance the effect of a temperature change on the resonance frequency of the resonator bar 1410. In particular, as the temperature increases, this will generally cause the resonator beam 1410 to have a lower resonance frequency. Additionally, because the expansion bar 1402 causes a compressive strain on the resonator beam 1410, this also causes a decrease in the resonance frequency. In such a situation, a temperature sensor that has enhanced frequency response to temperature is provided. By measuring the resonance frequency of the resonator beam 1410, temperature can be extrapolated using calibration and empirical methods.

Figure 15:
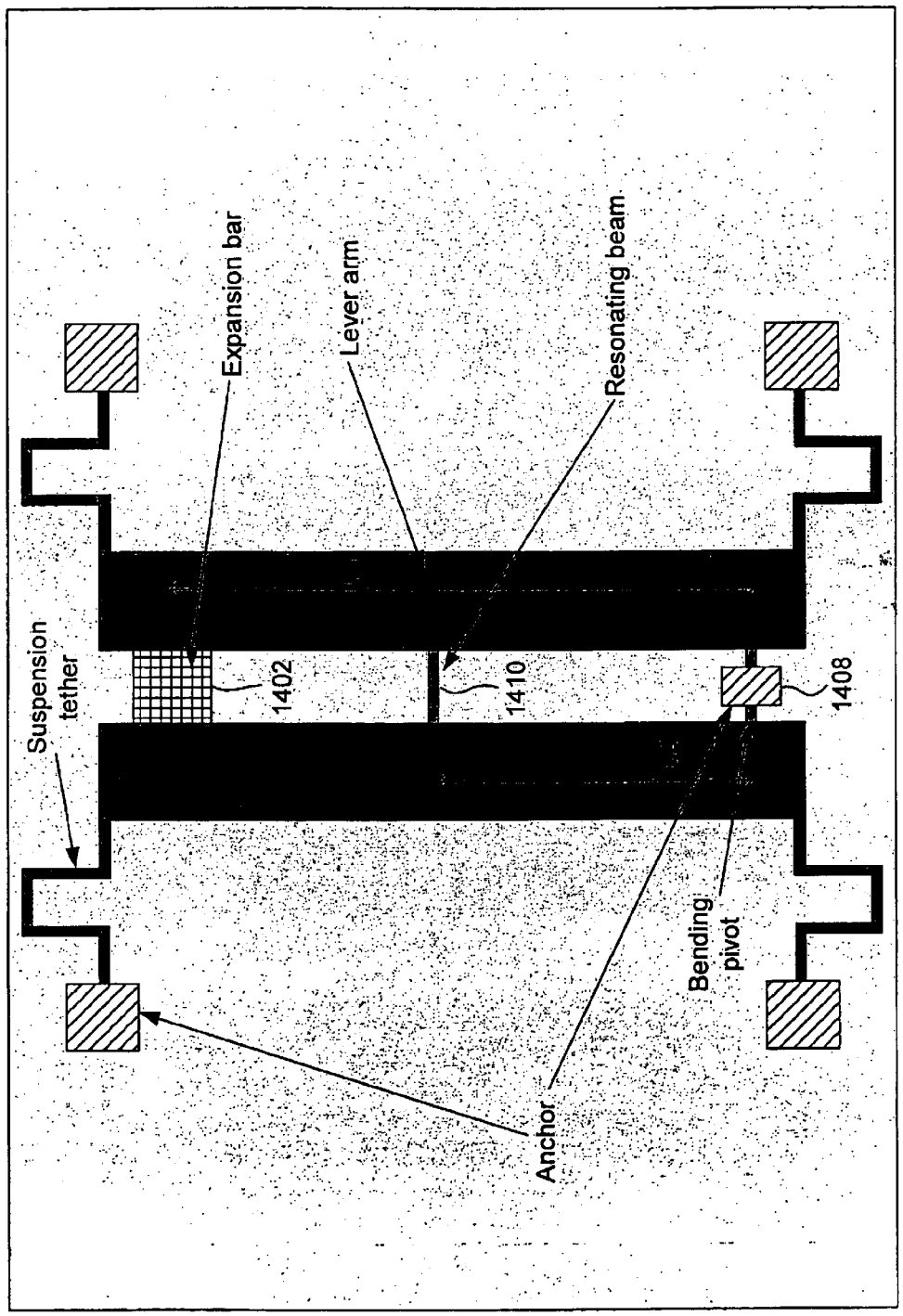
FIG. 15 illustrates a temperature corrected resonator according to the present invention.

Turning to FIG. 15, a temperature corrected resonator is shown. In this embodiment, the position of the bending pivot 1408 and the resonator bar 1410 have been reversed from FIG. 14. The result is that a rise in temperature causes the expansion bar 1402 to exert a tensile strain on the resonator beam 1410. The tensile strain on resonator beam 1410 tends to increase the resonance frequency. This then tends to counterbalance the beam expansion effect due to the rise in temperature. The tensile strain applied to the beam is approximately:

$$S=(\alpha_e-\alpha_b)\Delta TL_2/L_1$$

where $\alpha_b$ is the coefficient of thermal expansion for the resonator beam 1410.

To make the resonator beam 1410 completely insensitive to temperature, it is required that:

$$dS/dT=7t^2/L^2\alpha_b$$

Combining the two equations above we have the ratio:

$$L_2/L_1=7t^2/L^2\alpha_b/(\alpha_e-\alpha_b)$$

However, in this particular lever structure, because the ratio $L_2$ divided by $L_1$ is less than one, it may not be possible to completely make the resonator beam 1410 to be totally insensitive to temperature.

Figure 16:
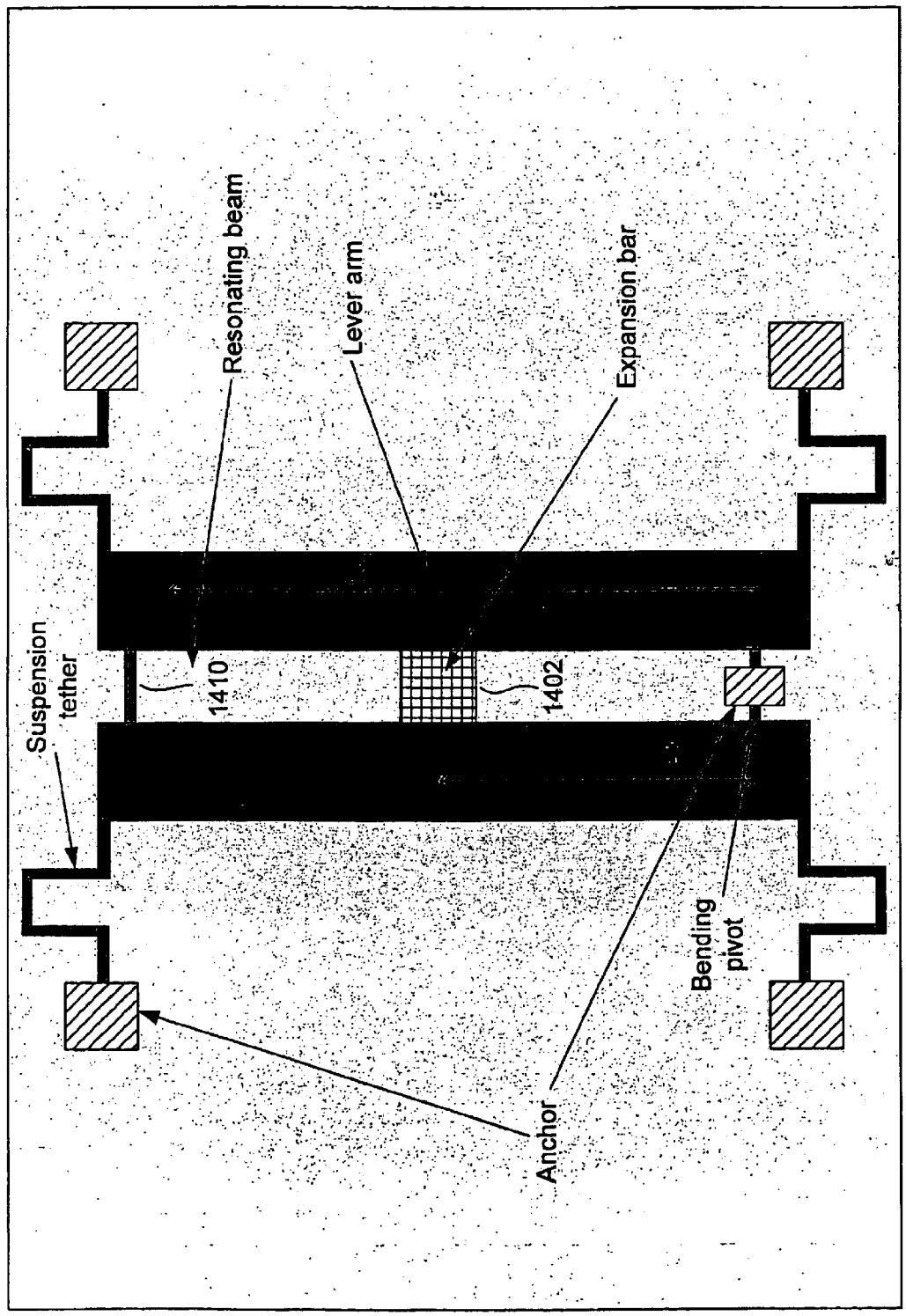
FIG. 16 illustrates an alternative embodiment of a temperature corrected resonator according to the present invention.

Turning to FIG. 16, in an alternative embodiment, the expansion bar 1402 and the resonator beam 1410 are switched positionally. In such an arrangement, if the structure FIG. 15 cannot satisfy the requirement for complete temperature insensitivity, by modifying the lengths of the lever arms $L_2$ and $L_1$, it may be possible to use the arrangement of FIG. 16 to completely satisfy temperature insensitivity.

Figure 17:
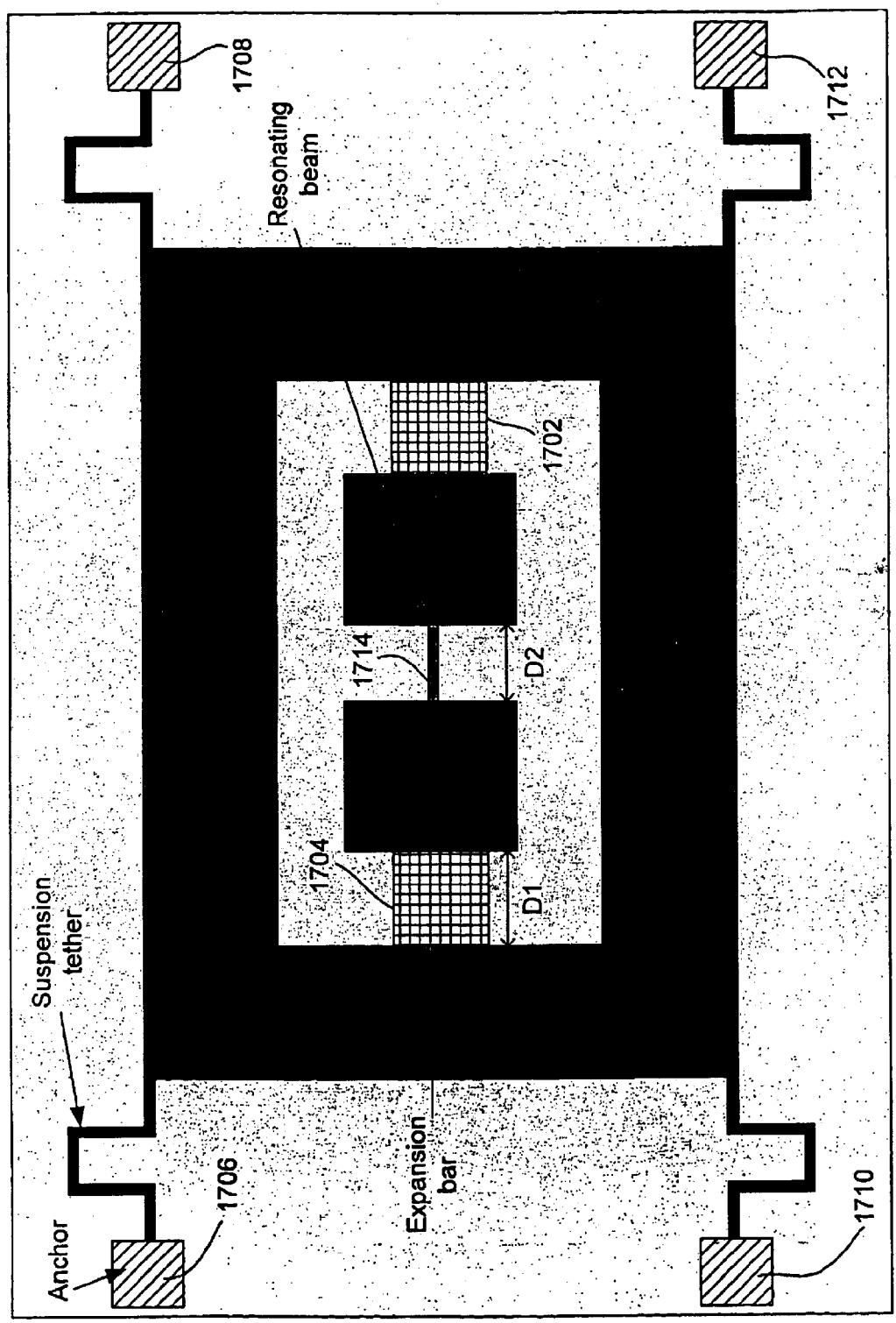
FIG. 17 illustrates a temperature sensor formed according to an alternative embodiment of the present invention.

Turning to FIG. 17, a temperature sensor is shown. In this structure, large expansion bars 1702 and 1704 are made of a material having a relatively large thermal expansion coefficient. The entire structure is suspended on anchors 1706, 1708, 1710, and 1712. The structure is suspended to the anchors by means of suspension tethers. This design decouples the thermal expansion of the substrate from the suspended structures. As the temperature rises, the expansion bars 1702 and 1704 expand, applying a compressive strain on the resonator beam 1714, therefore further reducing the frequency of the resonator beam 1714. As noted above, the increase in temperature will tend generally to lower the resonance frequency of the resonator beam 1714. The ratio $D_1/D_2$ governs the sensitivity. The compressive strain applied on the resonator beam 1714 is approximately:

$$S=2(\alpha_e-\alpha_b)\Delta TD_1/D_2$$

Figure 18:
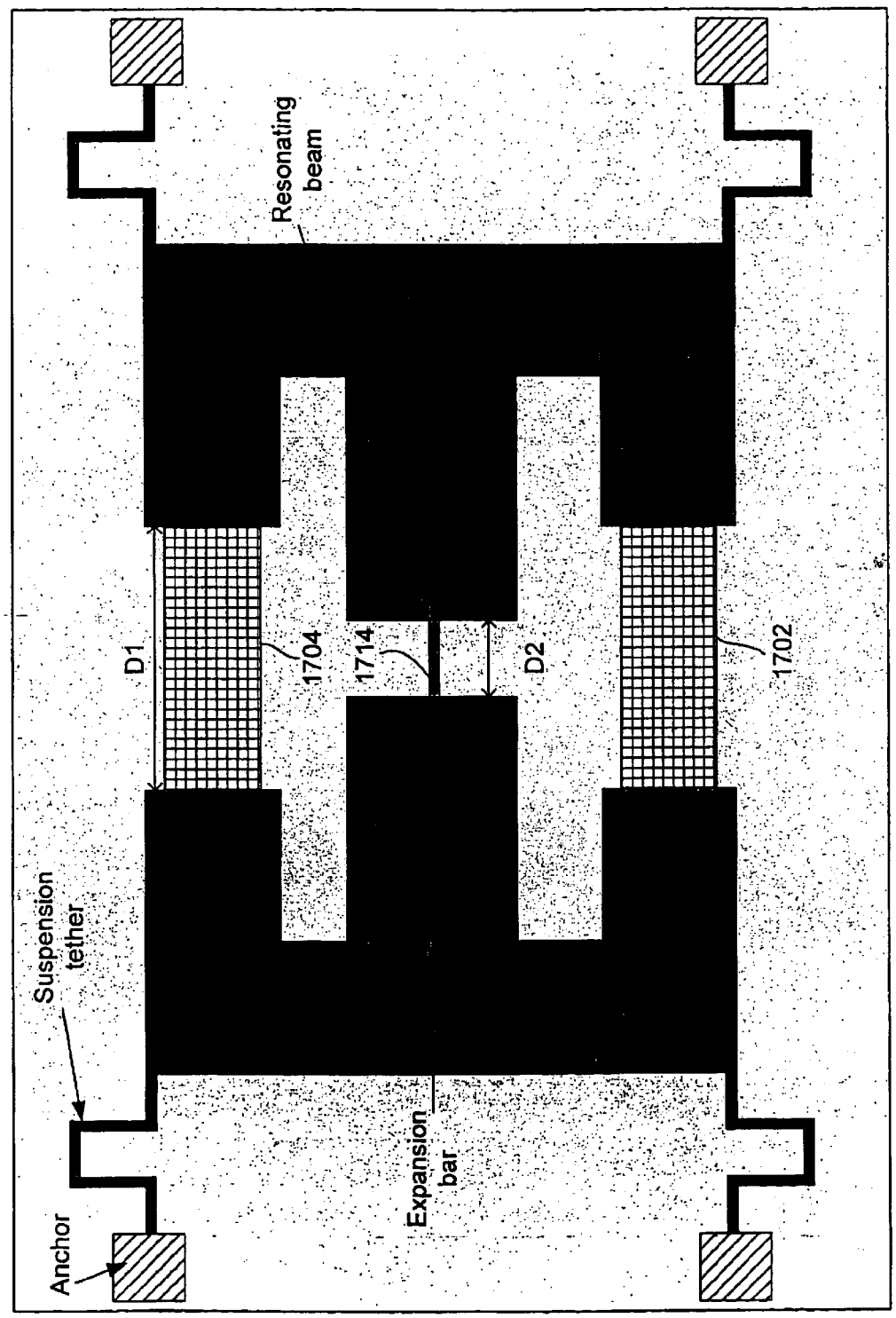
FIG. 18 illustrates an alternative embodiment of a temperature corrected resonator according to the present invention.

FIG. 18 shows a structure similar to that of FIG. 17 except that the position of the expansion bars 1702 and 1704 have been changed. As the temperature rises, the expansion bars 1702 and 1704 expand disproportionately, applying a tensile strain on the resonator beam 1714, therefore counterbalancing the beam expansion effect. This results in a temperature corrected resonator. The tensile strain applied on the resonator beam 1714 is:

$$S=(\alpha_e-\alpha_b)\Delta TD_1/D_2$$

To make the beam completely insensitive to temperature, it is required that:

$$dS/dT=7t^2/L^2\alpha_b$$

Combining the two equations above, we have the ratio:

$$D_1/D_2=7t^2/L^2\alpha_b/(\alpha_e-\alpha_b)$$

Figure 19:
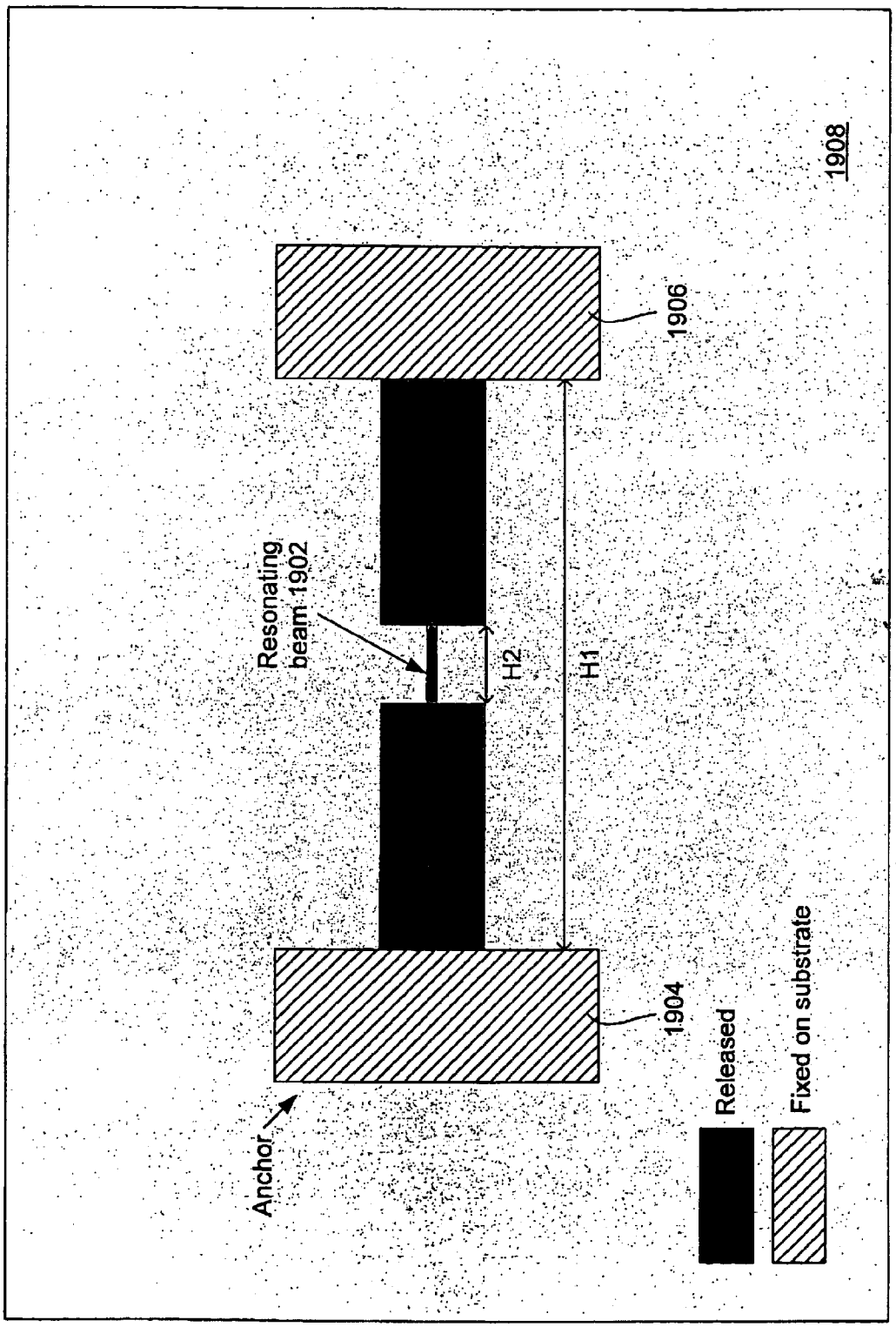
FIG. 19 illustrates yet another alternative embodiment of a temperature corrected resonator according to the present invention.

FIG. 19 illustrates a simple way of applying temperature sensitive compressive or tensile strain using the mismatch between the substrate and resonator beam coefficient of thermal expansions. In particular, a resonator beam 1902 is suspended between two anchors 1904 and 1906. The anchors 1904 and 1906 are formed on a substrate 1908. The resonator beam 1902 is made of a first material and the substrate is made of a second material. If there is a large mismatch between the thermal expansion coefficience of the resonator beam 1902 and the resonator substrate 1908, this mismatch can be used. For example, if the thermal expansion coefficient of the substrate is smaller than the thermal expansion coefficient of the resonator structure, then, as the temperature rises, the substrate 1908 may expand less, applying a compressive strain on the resonator beam 1902. This will reduce the frequency of the resonating beam 1902, thereby acting as a temperature sensor. The ratio $H_1/H_2$ governs the sensitivity. The compressive strain applied on the beam is approximately:

$$S=(\alpha_b-\alpha_s)\Delta T H_1/H_2$$

Where $\alpha_s$ is the coefficient of thermal expansion of the substrate.

If the thermal expansion coefficient of the substrate is larger than the thermal expansion coefficient of the resonator beam 1902, then the structure can be used as a temperature compensated resonator. The required condition is:

$$H_1/H_2=7t^2/L^2\alpha_b(\alpha_s-\alpha_b)$$

However, the above relationship may not be satisfied in some cases where there is the constraint of $H_1/H_2$ be greater than one for this geometry.

Figure 20:
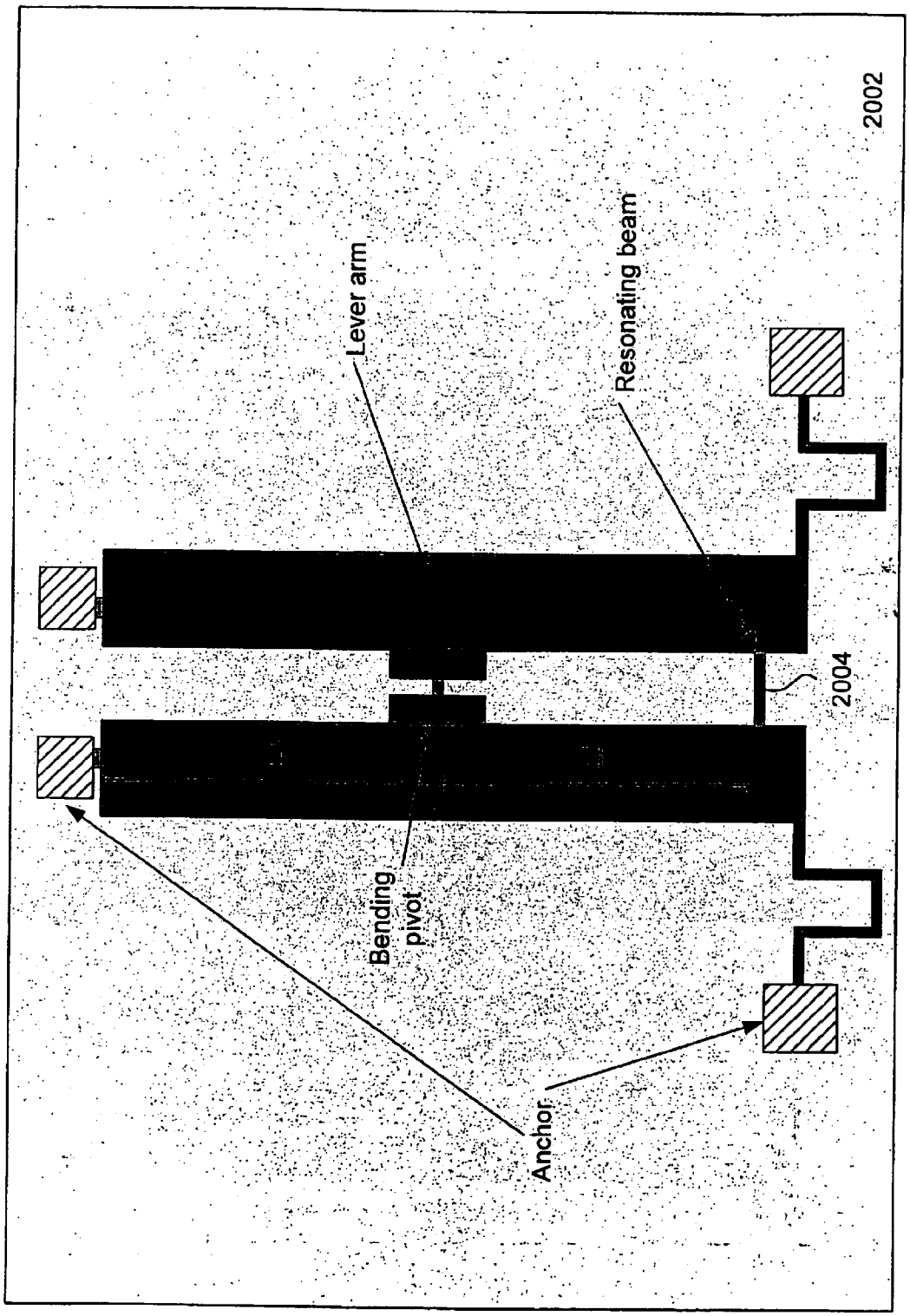
FIG. 20 illustrates yet another embodiment of a temperature sensor formed according to the present invention.

Turning to FIG. 20, a symmetric double lever structure utilizing thermal mismatch between the substrate and the resonator beam material is used advantageously. If the thermal expansion coefficient of the substrate 2002 is greater than the thermal expansion coefficient of the resonator beam 2004, this will tend to apply compressive strain on the resonator beam 2004, therefore further reducing the resonance frequency of the resonator beam 2004. This can be used again as a temperature sensor.

If, however, the thermal expansion coefficient of the resonator beam 2004 is greater than that of the substrate 2002, then a tensile strain develops in the resonator beam 2004 as the temperature rises. This counterbalances the beam expansion effect and the resonator beam is temperature compensated.

Figure 21:
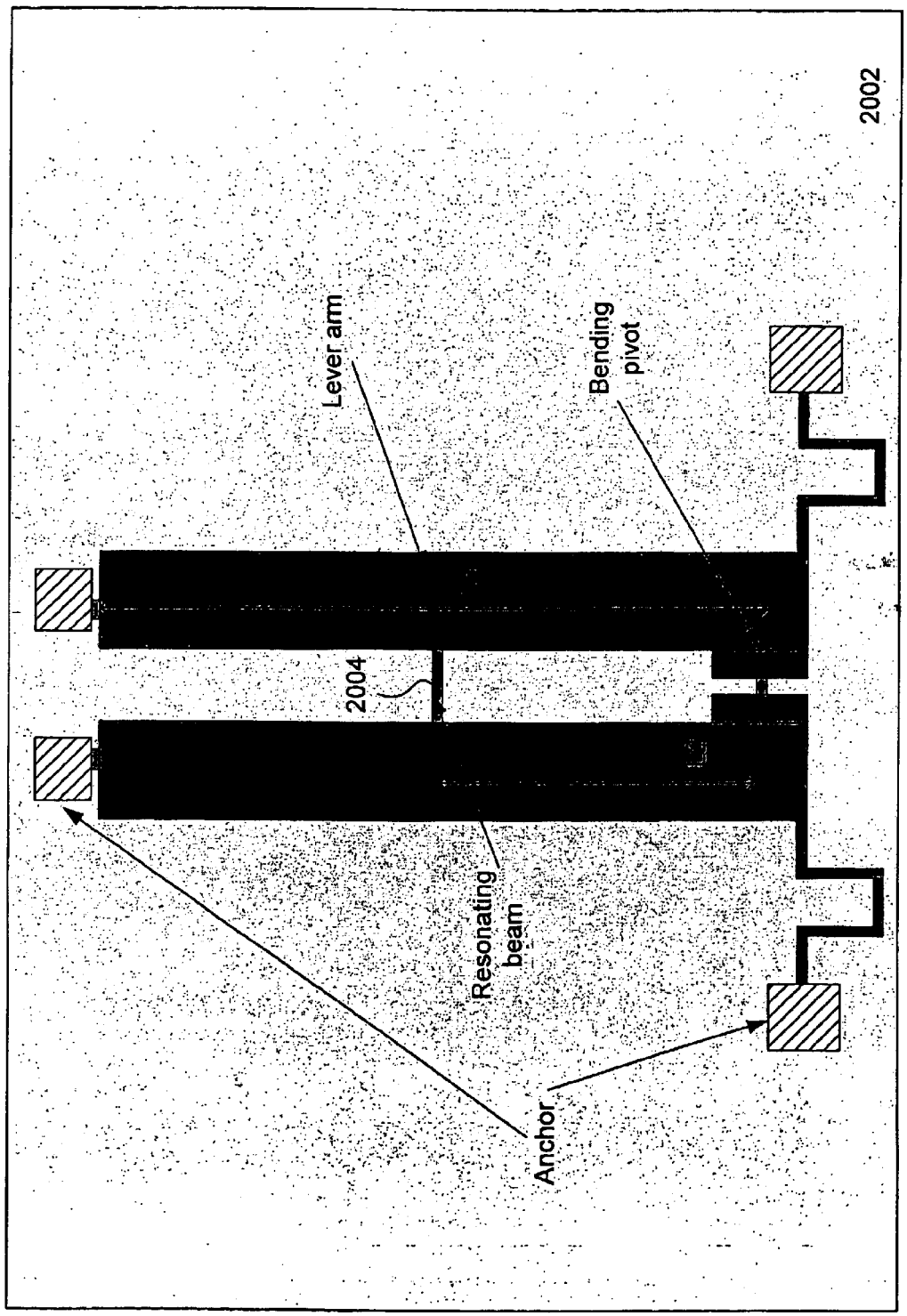
FIG. 21 illustrates another alternative embodiment of a temperature sensor formed according to the present invention.

Turning to FIG. 21, this structure is similar to that of FIG. 20 except that the positions of the bending pivot and the resonant beam 2004 are switched. In this situation, if the thermal expansion coefficient of the substrate is less than that of the resonator beam 2004, this will result in the application of a compressive strain on the resonator beam 2004 with a rise in temperature. This will further reduce the resonance frequency and would be suitable for an enhanced temperature sensor.

If, however, the thermal expansion coefficient of the substrate 2002 is greater than that of the resonator beam 2004, tensile strain develops in the resonator beam 2004 as the temperature rises, counterbalancing the beam expansion effect. This will find application for use in a temperature compensated resonator.

Figure 22:
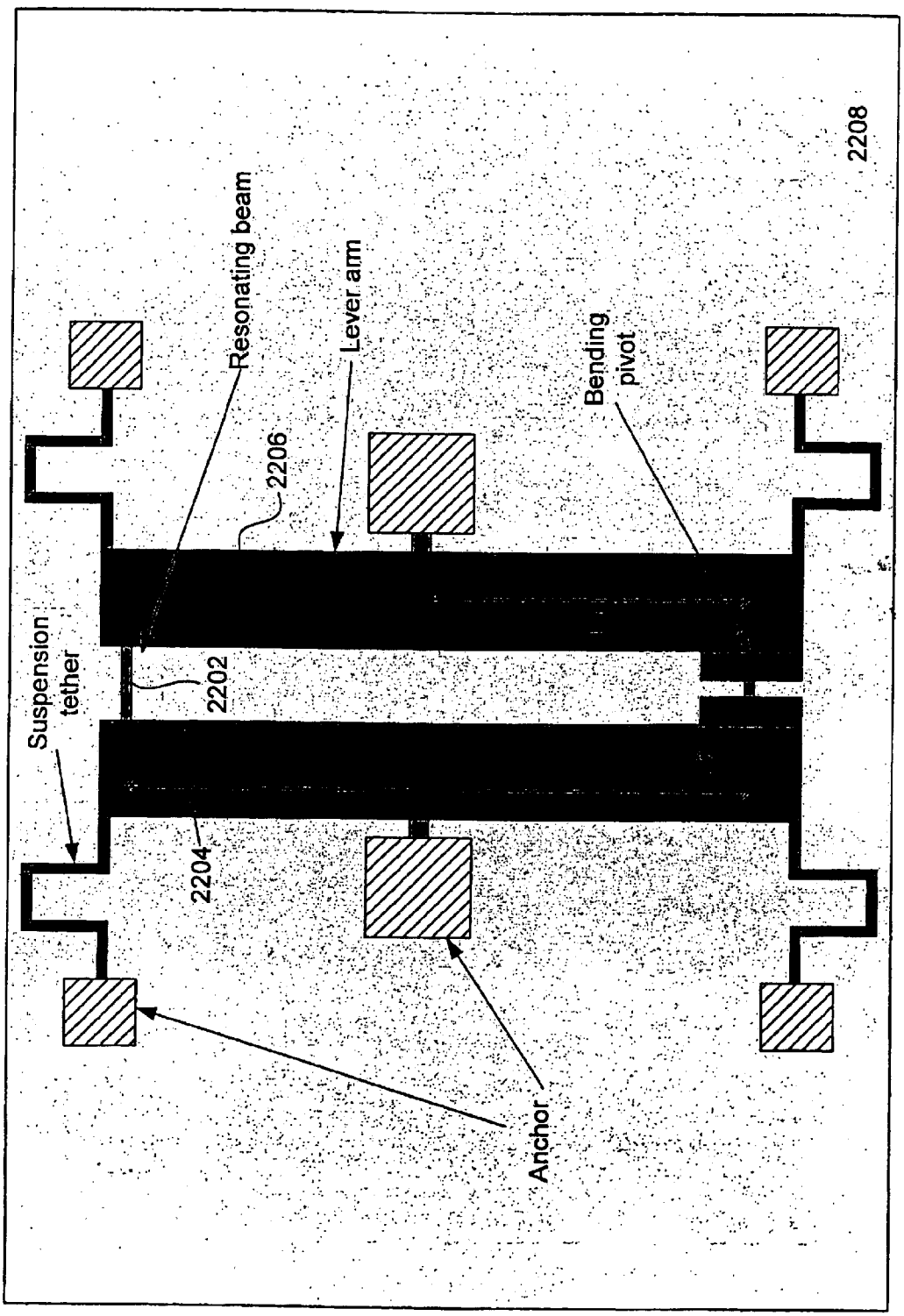
FIG. 22 illustrates yet another alternative embodiment of a temperature sensor formed according to the present invention.

Finally, turning to FIG. 22, a double cantilever structure with a resonator beam 2202 placed between two lever arms 2204 and 2206 is shown. If the thermal expansion coefficient substrate is greater than that of the resonator beam 2202, a substrate 2208 expands disproportionately with temperature, applying a compressive strain on a resonator beam 2202. This further reduces the resonance frequency and such an arrangement may be used as a temperature sensor. For the same structure, if the thermal expansion coefficient of the substrate 2208 is less than that of the resonator beam 2202, a tensile strain develops in the resonator beam 2202 if the temperature rises, thereby counterbalancing the beam expansion effect.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For example, while the bending beam and breathing bar types of mechanical resonators have been described, other types of mechanical resonators may also be substituted into the concepts and ideas of the present invention.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctorines of claim interpretation.

What is claimed is:

1. An apparatus comprising:
    a resonator beam having a first end and a second end, the resonator beam suspended above a substrate by the first end and the second end;
    a lever arm connected to a pivot and to the first end of the resonator beam; and
    an actuator coupled to the lever arm, the actuator applying an actuation force to the lever arm to apply strain onto the resonator beam, wherein the positions on the lever arm where the first end of the resonator beam is connected and where the actuation force is applied are on the same side of the pivot.

2. The apparatus of claim 1 wherein the actuator is a comb structure.

3. The apparatus of claim 1 wherein the actuator is a ratchet wheel.

4. The apparatus of claim 1 wherein the actuator is a ratchet wedge.

5. The apparatus of claim 1 wherein the actuator is a large coefficient of thermal expansion heater.

6. The apparatus of claim 1 wherein the actuator is a ratcheting shaft.

7. The apparatus of claim 1 wherein the actuation force supplied by the actuator is proportional to a temperature.

8. The apparatus of claim 7 wherein a tensile strain is applied to the resonator beam as the temperature increases.

9. The apparatus of claim 7 wherein a compressive strain is applied to the resonator beam as the temperature increases.

10. The apparatus of claim 2 wherein the comb structure exerts force on a curved beam that in turn transmits force onto the lever arm.

11. The apparatus of claim 1, further comprising a second lever arm connected to the second end of the resonator beam and using the second lever arm in concert with the first lever aim to apply a strain to the resonator beam.

12. The apparatus of claim 11 wherein the actuator applies the actuation force to both the lever arm and the second lever arm.

13. The apparatus of claim 11 wherein the lever arm and the second lever arm rotate about a pivot point so as to proportionally modify the amount of strain applied to the resonator beam.

14. The method of claim 11 wherein the actuator is an expansion bar that provides the actuation force proportional to a temperature.

15. An apparatus comprising:

a resonator beam having a first end and a second end, the resonator beam suspended above a substrate by the first end and the second end;

a lever arm connected to a pivot and to the first end of the resonator beam; and an actuator coupled to the lever arm, the actuator applying an actuation force to the lever arm to apply strain onto the resonator beam, wherein the positions on the lever arm where the first end of the resonator beam is connected and where the actuation force is applied are on opposite sides of the pivot.

16. The apparatus of claim 15 wherein the actuator is a comb structure.

17. The apparatus of claim 15 wherein the actuator is a ratchet wheel.

18. The apparatus of claim 15 wherein the actuator is a ratchet wedge.

19. The apparatus of claim 15 wherein the actuator is a large coefficient of thermal expansion heater.

20. The apparatus of claim 15 wherein the actuator is a ratcheting shaft.

21. The apparatus of claim 15 wherein the actuation force supplied by the actuator is proportional to a temperature.

22. The apparatus of claim 21 wherein a tensile strain is applied to the resonator beam as the temperature increases.

23. The apparatus of claim 21 wherein a compressive strain is applied to the resonator beam as the temperature increases.

24. The apparatus of claim 16 wherein the comb structure exerts force on a curved beam that in turn transmits force onto the lever arm.

25. The apparatus of claim 15 further comprising a second lever arm connected to the second end of the resonator beam and using the second lever arm in concert with the first lever arm to apply a strain to the resonator beam.

26. The apparatus of claim 25 wherein the actuator applies the actuation force to both the lever arm and the second lever arm.

27. The apparatus of claim 25 wherein the lever arm and the second lever arm rotate about a pivot point so as to proportionally modify the amount of strain applied to the resonator beam.

28. The apparatus of claim 25 wherein the actuator is an expansion bar that provides the actuation force proportional to a temperature.

29. A temperature compensated resonator comprising:

a resonator beam having a first end and a second end, the resonator beam suspended above a substrate by the first end and the second end;

a lever arm connected to a pivot and to the first end of the resonator beam; and an actuator connected to the lever arm, the actuator applying an actuation force to the lever arm to apply a tensile strain onto the resonator beam, the actuation force dependent upon a temperature.

30. The temperature compensated resonator of claim 29 wherein the actuator is an expansion bar.

31. The temperature compensated resonator of claim 29 wherein the actuator is an expansion bar acting on the lever arm.

32. The temperature compensated resonator of claim 29, further comprising a second lever arm connected to the second end of the resonator beam and using the second lever arm in concert with the first lever arm to apply the tensile strain to the resonator beam.

33. The temperature compensated resonator of claim 32 wherein the actuator applies the actuation force to both the lever arm and the second lever arm.

34. The temperature compensated resonator of claim 32 wherein the lever arm and the second lever arm rotate about a pivot point so as to proportionally modify the amount of tensile strain applied to the resonator beam.

35. A temperature sensor comprising:

a resonator beam having a first end and a second end, said resonator beam suspended above a substrate by said first end and said second end; and an expansion bar connected to said first end of said resonator beam, said actuator applying an actuation force to said resonator beam to apply a compressive strain onto said resonator beam, said actuation force dependent upon a temperature.

36. A temperature sensor comprising:

a resonator beam having a first end and a second end, said resonator beam suspended above a substrate by said first end and said second end; and an actuator connected to said first end of said resonator beam, said actuator applying an actuation force to said resonator beam to apply a compressive strain onto said resonator beam, said actuation force dependent upon a temperature, wherein said actuator is an expansion bar acting on said lever arm.

37. The apparatus of claim 36 wherein said actuator applies said actuation force to both said lever arm and said second lever arm.

38. The apparatus of claim 37 wherein said lever arm and said second lever arm rotate about a pivot point so as to proportionally modify the amount of tensile strain applied to said monitor beam.

* * * * *

UNITED STATES PATENT AND TRADEMARK OFFICE
CERTIFICATE OF CORRECTION

PATENT NO. : 6,954,020 B2
DATED : October 11, 2005
INVENTOR(S) : Ma et al.

It is certified that error appears in the above-identified patent and that said Letters Patent is hereby corrected as shown below:

Column 12,
Line 49, delete "monitor" and insert -- resonator --.

Signed and Sealed this

Twenty-seventh Day of December, 2005

JON W. DUDAS
*Director of the United States Patent and Trademark Office*